United States Patent [19]
Nakasuji

[11] Patent Number: 5,770,863
[45] Date of Patent: Jun. 23, 1998

[54] CHARGED PARTICLE BEAM PROJECTION APPARATUS

[75] Inventor: Mamoru Nakasuji, Yokohama, Japan

[73] Assignee: Nikon Corporation, Tokyo, Japan

[21] Appl. No.: 736,239

[22] Filed: Oct. 24, 1996

[30]     Foreign Application Priority Data

| Oct. 24, 1995 | [JP] | Japan | 7-275698 |
| Nov. 1, 1995 | [JP] | Japan | 7-285117 |
| Nov. 2, 1995 | [JP] | Japan | 7-285524 |

[51] Int. Cl.$^6$ ............................................. H01J 37/00
[52] U.S. Cl. ................................ 250/492.2; 250/396 R
[58] Field of Search ........................... 250/492.2, 492.22, 250/398, 396 R, 396 ML

[56]            References Cited

U.S. PATENT DOCUMENTS

| 4,198,569 | 4/1980 | Takayama | 250/396 ML |
| 4,213,053 | 7/1980 | Pfeiffer | 250/398 |
| 4,980,567 | 12/1990 | Yasuda et al. | 250/492.2 |
| 5,047,647 | 9/1991 | Itoh et al. | 250/491.1 |
| 5,631,113 | 5/1997 | Satoh et al. | 250/492.2 |

FOREIGN PATENT DOCUMENTS

| 5-160012 | 6/1993 | Japan . |
| 7-29793 | 1/1995 | Japan . |
| 7-57999 | 3/1995 | Japan . |
| 7-65766 | 3/1995 | Japan . |
| 7-130601 | 5/1995 | Japan . |

*Primary Examiner*—Kiet T. Nguyen
*Attorney, Agent, or Firm*—Cushman Darby & Cushman IP Group of Pillsbury Madison & Sutro LLP

[57]            ABSTRACT

In a charged particle beam projection apparatus in which a plurality of areas are defined in a mask and a pattern in each area is projected in a corresponding area on a substrate such as a semiconductor wafer or the like, in order to reduce aberration caused by magnetic lens or deflectors when projecting the mask pattern onto the substrate, the positioning and dimensions of these magnetic lenses or the deflectors are set so that specific relationships are achieved, or a distortion in the mask pattern projected on the substrate is corrected in correspondence to the partitioned areas on the mask pattern.

21 Claims, 13 Drawing Sheets

PRIOR ART

CHARGED PARTICLE BEAM PROJECTION APPARATUS

BACKGROUND OF THE INVENTION

1. Field of the Invention

The present invention relates to a charged particle beam projection apparatus that projects high density patterns such as semiconductor integrated circuits on a substrate such as a silicon wafer by employing a charged particle beam such as an electron beam or an ion beam, etc. More specifically, it relates to a charged particle beam projection apparatus that employs the partitioned projection method whereby the mask pattern is partitioned into a plurality of small areas and the pattern in each small area is projected onto the corresponding area on the substrate.

2. Description of the Related Art

The following explanation is given in reference to FIG. 12, which shows a schematic structure of a charged particle beam projection apparatus in the known art. Electron beam projection apparatuses exist in the known art which, in order to form minute patterns such as semiconductor memory elements and the like, project an original pattern image formed on a mask 1 onto a semiconductor wafer 10 (hereafter referred to as a "wafer") on which an electron beam resist has been applied, via an electron beam. In recent years, in order to project a pattern extending over a large area on the mask 1 onto a substrate with high throughput, a charged particle beam projection apparatus has been developed that employs the partitioned projection system, in which the pattern on the mask 1 is partitioned into a plurality of main fields 1a in direction y (the scanning direction) and each of the plurality of main fields 1a is further partitioned into a plurality of sub fields 1aa in direction x (the non-scanning direction) running perpendicular to direction y so that by deflecting an electron beam in order to sequentially project the patterns on the plurality of sub fields 1aa onto the wafer 10 and by scanning the wafer in the reverse direction in synchronization with the scanning of the mask parallel to direction y, a specific circuit pattern is sequentially projected onto each projection area (area corresponding to one die) on the wafer.

In such a charged particle beam projection apparatus, when projecting the mask pattern at a position relatively distant from the optical axis, since a charged particle beam passes through the area relatively distant from the optical axis which constitutes the projection lens, distortion tends to occur in the projected image due to aberration in the optical system. In order to reduce such distortion in the image caused by aberrations in the optical system, charged particle beam projection apparatuses employing;

(a) the MOL (Moving Objective Lens) system, the VAL (variable Axis Lens) system and the PREVAIL (Projection Exposure with Variable Axis Immersion Lenses) system or;

(b) the SMD (Symmetric Magnetic Doublet) system have been disclosed.

In each of the systems listed in (a), adjustment is made so that even when the charged particle beam enters an area relatively distant from the optical axis, the axis of the magnetic lens is moved an equivalent distance on to the trajectory of the charged particle beam to ensure the charged particle beam essentially passes along the optical axis by employing a deflector. Thus, since the charged particle beam, which enters the magnetic lens after passing through the individual sub fields of the mask, passes along the optical axis of the magnetic lens equivalently, the effect of lens aberration is reduced.

Now, a charged particle beam projection apparatus employing the SMD system is explained in reference to FIG. 13. FIG. 13 is a schematic diagram of the projection lens of the charged particle beam projection apparatus, with a point on the optical axis that divides the distance between the mask 1001 and the substrate 1010 into portions at the ratio of M:1 when the reduction rate of the charged particle beam projection apparatus is set at 1/M (1<M<20) defined as a crossover 1005. The projection lens is constituted with a pair of magnetic lenses 1002 and 1003 provided on either side of the crossover 1005. Furthermore, these magnetic lenses 1002 and 1003 satisfy the following symmetric magnetic doublet requirements (SMD requirements).

Namely, when, in regard to the magnetic lens 1002, the distances between its principal plane 1002a and the mask 1001 and between the principal plane 1002a and the crossover 1005 are respectively designated LM1 and LC1, the bore radii of the magnetic poles 1021a and 1021b are respectively designated R1 and R2 and the distances between the crossover 1005 and the surface 1211a of the crossover side magnetic pole 1021a and between the crossover 1005 and the surface 1211b of the mask side magnetic pole 1021b are respectively designated A1 and A2, and in regard to the magnetic lens 1003, the distances between its principal plane 1003a and the substrate 1010 and between the principal plane 1003a and the crossover 1005 are respectively designated LW2 and LC2, the bore radii of the magnetic poles 1031a and 1031b are respectively designated r1 and r2 and the distances between the crossover 1005 and the surface 1311a of the crossover side magnetic pole 1031a and between the crossover 1005 and the surface 1311b of the wafer side magnetic pole 1031b are respectively designated a1 and a2, the relationships expressed in the following numerical expressions:

$$LM1=LC1, \ LW2=LC2 \tag{1}$$

$$R1/r1=R2/r2=M \tag{2}$$

$$A1/a1=A2/a2=M \tag{3}$$

and the numbers of AT (ampere-turns) in the magnetic lenses 1002 and 1003 are equal to each other with the directions of the magnetic fields formed by these two magnetic lenses running opposite each other. It has been theorized that, by making these settings to satisfy the requirements described above, no anisotropic aberration, no distortion or transverse chromatic aberration occurs in the image formed on the substrate 1010.

However, in the systems listed in (a), since a deflector is employed to shift the axis of the magnetic lens to a location equivalent to the trajectory, a deflection aberration caused by the deflector itself occurs, although the aberration caused by the lens is reduced. It is difficult, in principle, to reduce this deflection aberration (in particular, a distortion) and also there is a problem in that, because of the deflection aberration, neither the main fields nor sub fields can be large. As for the system in (b), since the astigmatism and the field curvature aberration component in the lens aberration remains uncorrected, the aperture cannot be made large. Thus, there is a problem in that, due to the space charge effect, which generates beam blur, projection cannot be performed with a large beam current. Consequently, high throughput cannot be achieved. Moreover, it has been learned that when the aberration is actually measured (or simulated on a computer) using a conventional apparatus which is set to satisfy the SMD requirements explained earlier, large distortion occurs.

SUMMARY OF THE INVENTION

To address the problems described above, an object of the present invention is to provide a charged particle beam projection apparatus with which it is possible to reduce distortion in the projection due to distortion caused by deflection distortion in the deflection system (deflector) or distortion in the combination of the projection lens system and the deflector when projecting a pattern on a mask onto a substrate.

In a first aspect according to the present invention that is adopted in a charged particle beam projection apparatus which, with each of the main fields on a mask partitioned into a plurality of sub fields, projects the pattern of the mask onto a substrate by forming an image of a charged particle beam on the substrate with a projection lens and sequentially projecting the pattern contained in each of the sub fields, the charged particle beam projection apparatus comprises a first deflector provided at a stage preceding the projection lens or in the projection lens to deflect the charged particle beam that has passed through a sub field in such a manner that it advances along the optical axis of the projection lens and a second deflector that deflects the charged particle beam having passed through the projection lens to guide the beam to a position on the substrate corresponding to the position of the sub field on the mask, in order to achieve the object described above.

The charged particle beam projection apparatus in a second aspect and a third aspect according to the present invention projects a pattern of a mask onto a substrate with a reduction rate of 1/M by forming the image of a charged particle beam which has been transmitted through the mask onto the substrate with a first magnetic lens and a second magnetic lens. In this charged particle beam projection apparatus, (a) the position where the distance between the mask and the substrate on the optical axis is partitioned into two portions which satisfy the ratio of M:1 is defined as a crossover, (b) the first magnetic lens is provided between the mask and the crossover and the second magnetic lens is provided between the crossover and the substrate, (c) the first and second magnetic lenses are provided in such a manner that the absolute values of the numbers of ampere-turns of the coils at the magnetic lenses are equal to each other and that the directions of the electric currents running through these coils are set opposite from each other and (d) the following relationships $$D1=M \cdot d1, D2=M \cdot d2$$

$$A1=M \cdot a1, A2=M \cdot a2$$

are achieved between the bore diameter D1 of a mask side magnetic pole, the bore diameter D2 of a crossover side magnetic pole, the distance A1 between the crossover and the crossover side surface of the mask side magnetic pole and the distance A2 between the crossover and the mask side surface of the crossover side magnetic pole, all related to the first magnetic lens, and the bore diameter d1 of a substrate side magnetic pole, the bore diameter d2 of a crossover side magnetic pole, the distance a1 between the crossover and the crossover side surface of the substrate side magnetic pole, and the distance a2 between the crossover and the substrate side surface of the crossover side magnetic pole, all related to the second magnetic lens respectively.

In addition, the charged particle beam projection apparatus in the second aspect achieves the object described above by ensuring that at least one of the following equations $$D3=M \cdot d3, D4=M \cdot d4$$

$$A3=M \cdot a3, A5=M \cdot a5, A6=M \cdot a6$$

is satisfied between the lens casing inner diameter D3, the lens casing outer diameter D4, the coil inner diameter D5, the coil outer diameter D6, the distance A3 between the crossover and the surface of the crossover side coil, the distance A4 between the crossover and the surface of the mask side coil, the thickness A5 of the crossover side magnetic pole and the thickness A6 of the mask side magnetic pole, all related to the lens casing and the coil of the first magnetic lens, and the lens casing inner diameter d3, the lens casing outer diameter d4, the coil inner diameter d5, the coil outer diameter d6, the distance a3 between the crossover and the surface of the crossover side coil, the distance a4 between the crossover and the surface of the substrate side coil, the thickness a5 of the crossover side magnetic pole and the thickness a6 of the substrate side magnetic pole, all related to the core and the coil of the second magnetic lens.

$$D3=M \cdot d3, D4=M \cdot d4$$

$$A3=M \cdot a3, A5=M \cdot a5, A6=M \cdot a6$$

The charged particle beam projection apparatus in the third aspect according to the present invention achieves the object described above by ensuring that when $\epsilon$ and $\beta$ are arbitrary positive real numbers that satisfy $\epsilon<\beta$, the relationship between the lens casing inner diameter D3 of the first magnetic lens and the lens casing inner diameter d3 of the second magnetic lens satisfies $D3=M \cdot d3-\epsilon$, and the relationship between the lens casing outer diameter D4 of the first magnetic lens and the lens casing outer diameter d4 of the second magnetic lens satisfies $D4=M \cdot d4-\beta$.

In the charged particle beam projection method in a fourth and a fifth aspect according to the present invention, a plurality of main fields are defined on a mask, and each of them is partitioned into a plurality of sub fields in which projection patterns are formed. The plurality of sub fields are sequentially irradiated with a charged particle beam. The mask and the substrate move in synchronization with each other so that a pattern in each of the sub fields is projected onto a substrate via an image forming lens system. Distortion of the projection image to be projected onto the substrate is corrected in each of the sub fields. The image forming lens system comprises a deflection system that deflects a charged particle beam that has passed through the pattern in each of the sub fields of the mask and a projection lens system that focuses the charged particle beam that has passed through the pattern in each of the sub fields on the substrate.

In the fourth aspect, the distortion of the projection image projected on the substrate is caused by the combination of the projection lens system and the deflection system. An image forming position of the projection pattern is corrected for each of the sub fields via the deflection system.

In the fifth aspect, the distortion of the projection image projected on the substrate is caused when one of the sub fields is selected to be irradiated with the charged particle beam by the deflection system. A quantity of deflection imparted by the deflection system is corrected for each of the sub fields in correspondence to the distortion of the projection pattern projected on the substrate.

DESCRIPTION OF THE PREFERRED EMBODIMENTS

The first through third embodiments of the present invention are explained in reference to FIGS. 1–4.

First Embodiment

Figure 1:
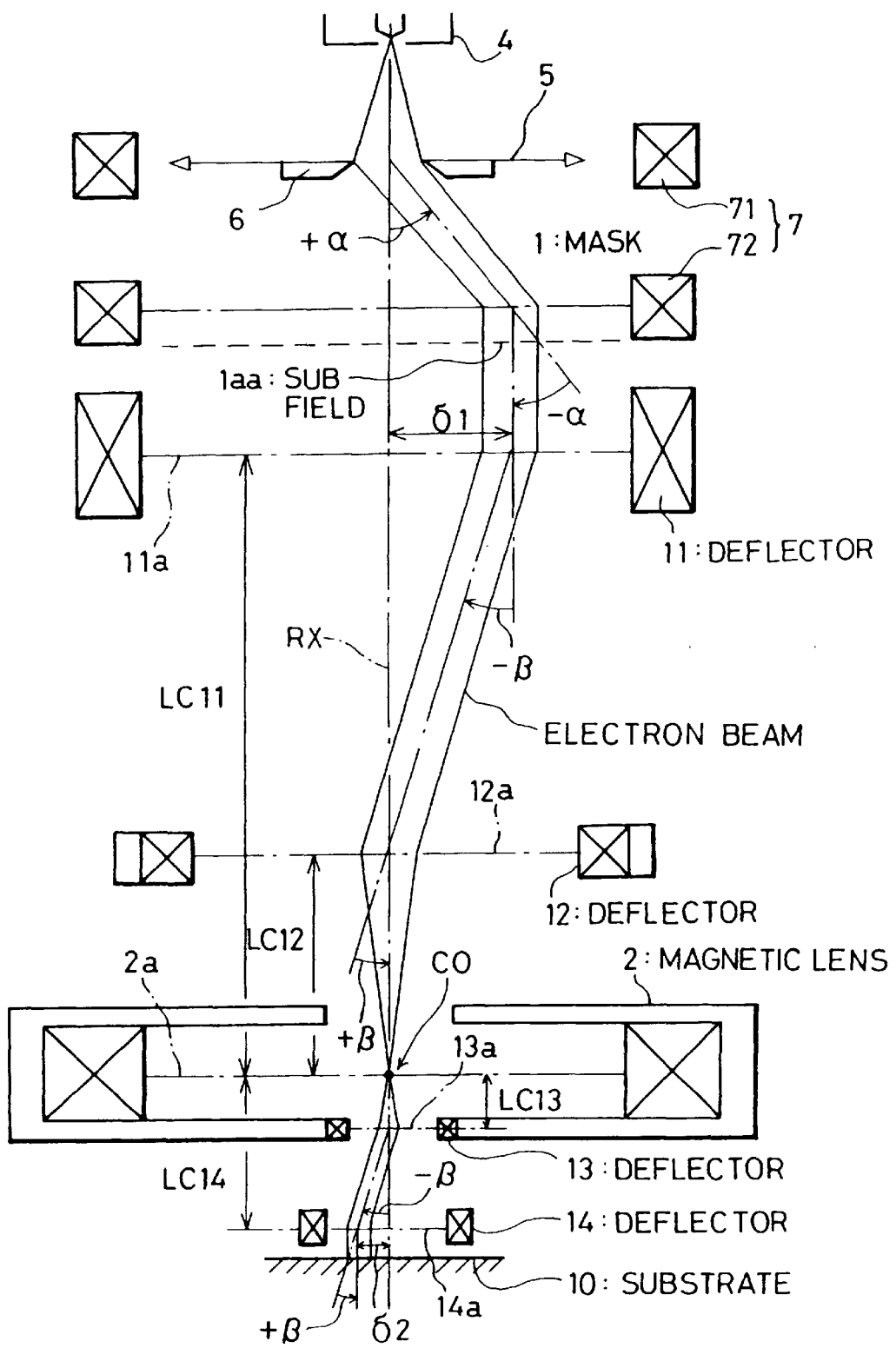
FIG. 1 illustrates a first embodiment of the charged particle beam projection apparatus according to the present invention.

FIG. 1 illustrates the first embodiment of the charged particle beam projection apparatus according to the present invention, which shows a schematic structure of an electron beam projection apparatus that performs projection using an electron beam. In this embodiment, when the reduction rate is set at 1/M (0.1<M<100, preferably 1<M<20), the point on the optical axis where the distance between a mask 1 and a substrate 10 is divided into portions that satisfy the ratio M:1 is defined as a crossover.

Reference number 4 indicates an electron gun which is the source of the electron beam, reference number 5 indicates a condenser lens that converts the electron beam emitted by the electron gun 4 to a parallel beam and reference number 6 indicates an aperture that reshapes the electron beam that has been converted to a parallel beam at the condenser lens 5 to a square shape. Reference number 7 indicates a sub field selecting deflector constituted with a pair of deflectors 71 and 72, which induces the shaped electron beam to a sub field 1aa of the mask 1. Reference number 2 indicates a magnetic lens that constitutes a projection lens while reference numbers 11, 12, 13 and 14 indicate deflectors that are used to deflect the track of the electron beam.

The magnetic lens 2 is positioned in such a manner that the position of its principal plane 2a intersects the position of the crossover CO. In addition, this embodiment is constituted to ensure that when the distance between the crossover CO and the deflection center 11a of the deflector 11, the distance between the crossover CO and the deflection center 12a of the deflector 12, the distance between the crossover CO and the deflection center of the deflector 13 and the distance between the crossover CO and the deflection center of the deflector 14 are respectively designated LC11, LC12, LC13 and LC14, the following equation (4) is achieved:

$$LC11/LC14 = LC12/LC13 = M \tag{4}$$

The electron beam, after having been shaped at the square aperture 6, is deflected by the sub field selecting deflector 71 by an angle of $+\alpha$ in the counter clockwise direction in the figure relative to the direction of the beam and then is deflected by an angle of $-\alpha$ by the sub field selecting deflector 72 so that it becomes a beam parallel to the optical axis RX to be irradiated vertically to the sub field 1aa, which is away from the optical axis RX by a distance of $\delta 1$. Note that in the mask 1, a plurality of sub fields 1aa are formed in a row extending horizontally in the figure. It is defined that when the electron beam passes along a given plane (represented by the paper on which this drawing is made), beam deflection in the counter clockwise direction along the plane is a deflection with a positive angle, whereas a deflection in the clockwise direction is a deflection with a negative angle.

The electron beam, after having been transmitted through a sub field 1aa of the mask 1, is then deflected at the deflector 11 by an angle of $-\beta$ and intersects the optical axis RX at the deflection center 12a of the deflector 12. The electron beam is deflected at the deflector 12 by an angle of $+\beta$ and then advances along the optical axis RX to enter the magnetic lens 2. The electron beam having thus entered the magnetic lens 2, passes through the crossover CO, is deflected at the deflector 13 by an angle of $-\beta$ and then deflected at the deflector 14 by an angle of $+\beta$ to become a beam parallel to the optical axis RX to enter the substrate 10 vertically.

Now, the equation (4) indicates that $$LC11 - LC12 = M \cdot (LC14 - LC13) \tag{5}$$

is true. This demonstrates that the distance $\delta 1$ between the electron beam which enters the deflector 11 and the optical axis RX and the distance $\delta 2$ between the electron beam which has been deflected at the deflector 14 to become parallel to the optical axis RX and the optical axis RX maintain a relationship which is expressed as $\delta 1 = M \cdot \delta 2$. In other words, the mask pattern in the sub field 1aa is projected at a corresponding position on the substrate 10 at the reduction rate of 1/M in the horizontal direction in FIG. 1. In addition, since, when the electron beam passes through a sub field which is relatively distant from the optical axis by a considerable distance, since the length of the optical path increases compared to a case in which the electron beam passes through a sub field in the vicinity of the optical axis, beam blur will occur. However, by adjusting the excitation current at the magnetic lens 2, it is possible to ensure that the beam blur will be small over all the sub fields.

As described above, since, in this embodiment, regardless of which mask pattern in a sub field within a main field is being projected, the electron beam is deflected at the deflectors 11 and 12 so that it passes along the axis of the magnetic lens 2, the effect of lens aberration on the image projected onto the substrate 10 is reduced. In addition, since the deflecting angle at the deflector 11 and the deflecting angle at the deflector 14 are equal to each other while running in opposite directions from each other, and the deflecting angle at the deflector 12 and the deflecting angle at the deflector 13 are equal to each other while running in opposite directions from each other, the deflection aberration due to the deflection of the deflector 11 and the deflection aberration due to the deflection of the deflector 14 cancel each other out, likewise the deflection aberration due to the deflection at the deflector 12 and the deflection aberration due to the deflection at the deflector 13 cancel each other out, to minimize the effect of deflection aberrations on the projected image.

Figure 2:
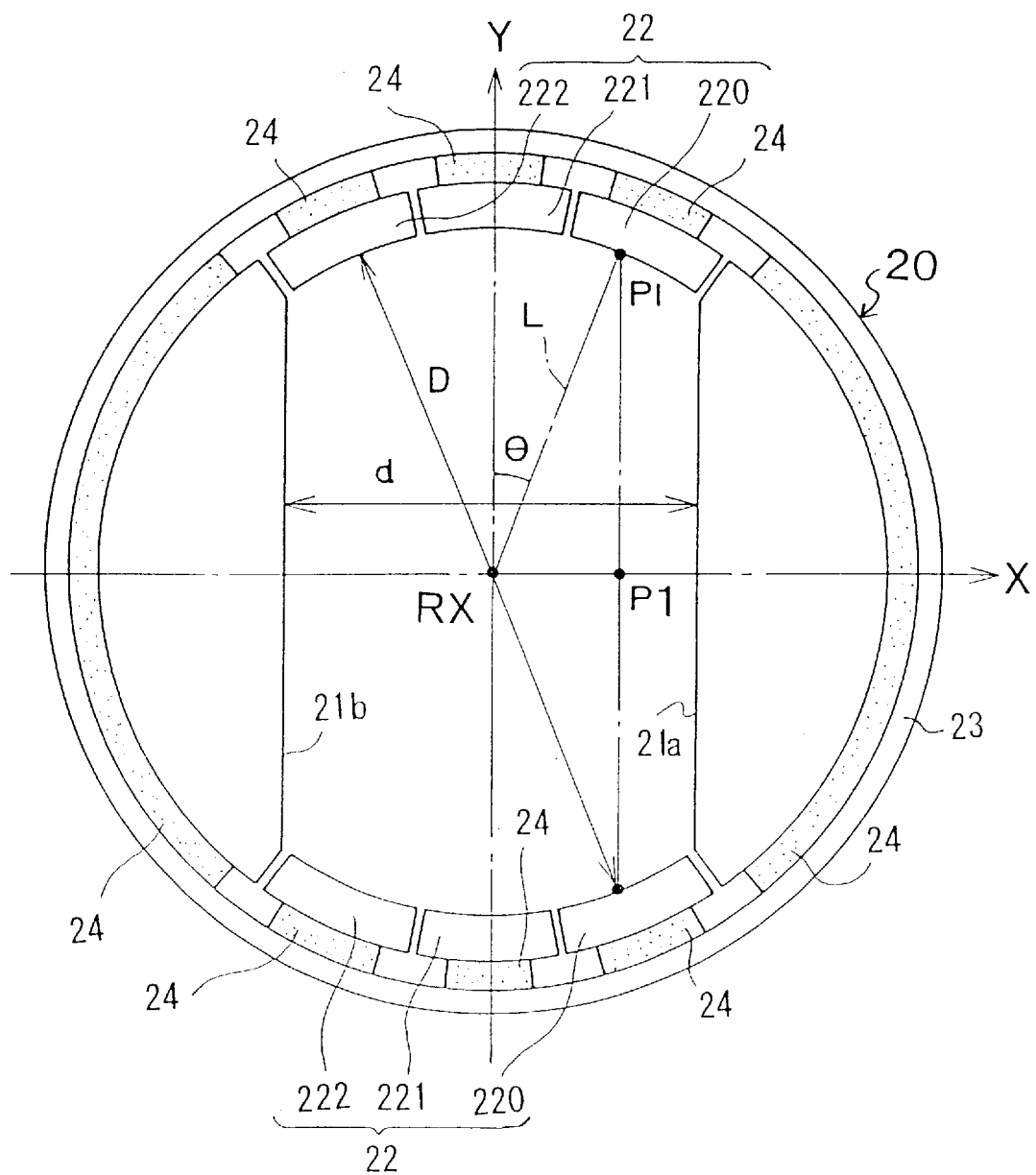
FIG. 2 is a cross section of a multi-electrode type electrostatic deflector.

The multi-electrode type electrostatic deflector shown in FIG. 2 may be employed for the deflectors 11 and 14 in the charged particle beam projection apparatus shown in FIG. 1 when the charged particle beam is to be deflected in one direction only. FIG. 2 shows a cross section along the principal plane of the multi-electrode type electrostatic deflector 20. Known 8-electrode type electrostatic deflectors include the one disclosed in Japanese Unexamined Patent Publication No.7-65766 and, as shown in the figure, a correction electrode 22, which is constituted with 3 pairs of electrode portions 220, 221 and 222, is positioned between a pair of parallel electrodes 21a and 21b to correct the ununiformity in the equipotential surfaces at both ends of the parallel electrodes 21a and 21b. The parallel electrodes 21a and 21b and the electrode portions 220–222 are all secured to the internal circumferential surface of a metal cylinder 23 via an insulator 24. The electrode portions 220–222 are shaped so that they constitute a portion of a cylindrical shape coaxial to the optical axis RX and are used to deflect the charged particle beam in direction X in the figure.

The details of the voltages to be applied are disclosed in Japanese Unexamined Patent Publication No. 7-65766 and in this document, only the conclusions are disclosed. In FIG. 2, in order to deflect an electron beam in the direction of the X axis, voltages at +A(V) and at −A(V) are respectively applied to the parallel electrode 21a and the parallel electrode 21b, and voltages at 0(V), at (A·D/d)·sin θ (V) and at −(A·D/d)·sin θ (V) are respectively applied to the electrode portions 221, 220, and 222. In these voltages, θ represents the angle formed by the line L connecting the central position P1 of one of the internal circumferential surfaces of the electrode portions 220 or 222 to the optical axis RX relative to the direction extending parallel to the surfaces of the parallel electrodes 21a and 21b facing opposite each other, d represents the distance between the surfaces of the parallel electrodes 21a and 21b facing opposite each other and D represents the inner diameter of the electrode portions 220–222. By using an electrostatic deflector with a cross section such as this, the maximum field dimension can be set at a large value, at approximately 90% of d.

By applying these voltages to the respective electrodes, the equipotential surface in the vicinity of the electrode portions 221 is corrected to extend in a direction parallel to the surfaces of the parallel electrodes 21a and 21b facing opposite each other to achieve deflection with a high degree of accuracy as in the central area of the parallel electrodes 21a and 21b. Thus, since even an electron beam relatively distant from the optical axis RX passes through an area where the equipotential surface is parallel, distortion of the image formed on the substrate 10 can be reduced. Normally, the only requirement imposed upon this electrostatic deflector is that it be a multi-electrode electrostatic deflector with at least 6 electrodes. In other words, there may be only 2 pairs of electrodes in place of electrodes 220, 221 and 222.

In addition, in the case of an octupole electrostatic deflector in which 8 electrodes have widths equal to one another, the inner diameter of the deflector 11 may be set at least 4 times the radius of the largest field on the mask 1, with the inner diameter of the deflector 14 set at least 4 times the maximum radius of the projected image on the substrate 10 which corresponds to the maximum field radius on the mask 1. Since the electric field generated by the deflector 11 is constant within an area from the center of the deflector 11 up to approximately ¼ of the inner diameter, by setting the inner diameter of the deflector 11 as explained above, it is possible to cause even an electron beam that has passed through a sub field in the vicinity of the edge of the mask to pass through an area where the electromagnetic field (electric field in the case of an electrostatic deflector or a magnetic field in the case of a electromagnetic deflector) of the deflector 11 is constant. The same concept applies to the deflector 14, and by making the dimensional settings as described above, it is possible to ensure that the electron beam travels through an area where the electromagnetic field of the deflector 14 is constant even when the electron beam that has passed through the vicinity of the fringe of the deflector 11 passes through the vicinity of the fringe of the deflector 14. As a result, the distortion of the image that is related to the consistency of the electric field of the deflectors 11 and 14 is reduced.

Second Embodiment

Figure 3:
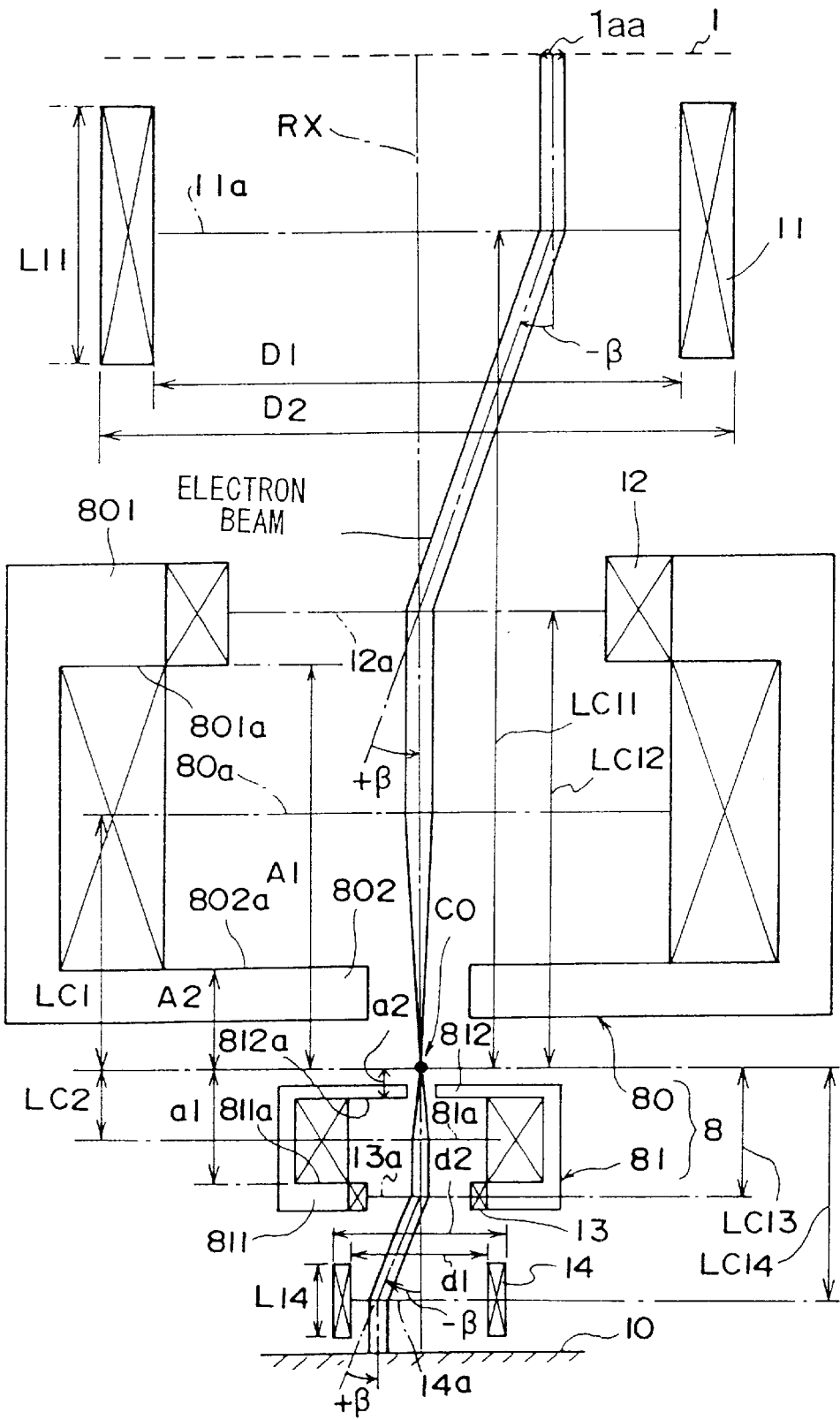
FIG. 3 illustrates a second embodiment of the charged particle beam projection apparatus according to the present invention.

FIG. 3 illustrates the second embodiment of the charged particle beam projection apparatus according to the present invention in which the projection lens is constituted with two magnetic lenses. FIG. 3 is a schematic diagram of the portion related to the projection lens with the same reference numbers designated to components identical to those in the charged particle beam projection apparatus shown in FIG. 1. In this embodiment, the projection lens 8 is constituted with two magnetic lenses 80 and 81 with the deflector 12 fitted in on the inside of a magnetic pole 801 of the mask side magnetic lens 80 and the deflector 13 fitted in on the inside of the magnetic pole 811 of the substrate side magnetic lens 81 respectively.

When the reduction rate of the projection apparatus is set at 1/M, the distance between the crossover CO and the principal plane 80a of the magnetic lens 80 is designated LC1, and the distances between the crossover CO and the surface 801a of the crossover side magnetic pole 801 and between the crossover CO and the surface 802a of a mask side magnetic pole 802 are respectively designated A1 and A2, all related to the magnetic lens 80, and the distance between the crossover CO and the principal plane 81a of the magnetic lens 81 is designated LC2 and the distances between the crossover CO and the surface 811a of a crossover side magnetic pole 811 and between the crossover CO and the surface 812a of the substrate side magnetic pole 812 are respectively designated a1 and a2, all related to the magnetic lens 81, the expressions (3) and (6) explained earlier are satisfied, as follows:

$$A1/a1=A2/a2=M \quad (3)$$

$$LC1/LC2=M \quad (6)$$

In addition, the ratio of the focal lengths of the magnetic lenses 80 and 81 is set at M (4, for instance):1, and the currents at the magnetic lenses 80 and 81 are set to ensure that the directions of the magnetic fields formed by the magnetic lenses 80 and 81 are opposite each other. Furthermore, the deflectors 11–14 satisfy the equation (4) explained earlier, with the following equation (7) being satisfied between the inner diameter D1, the outer diameter D2 and the length in the axial direction L11 of the deflector 11 and the inner diameter d1, the outer diameter d2 and the measurement in the axial direction L14 of the deflector 14, as follows:

$$LC11/LC14=LC12/LC13=M \quad (4)$$

$$D1/d1=D2/d2=L11/L14=M \quad (7)$$

As in the first embodiment, an electron beam running parallel to the optical axis RX is irradiated at the sub field 1aa of the mask 1. The electron beam that has been transmitted through the sub fields 1aa is deflected at the deflector 11 by an angle of −β and intersects the optical axis RX at the deflection center 12a of the deflector 12. The electron beam is then deflected at the deflector 12 by an angle of +β and passes through the magnetic lens 80 along the optical axis RX. After passing through the magnetic lens 80, the crossover CO and the magnetic lens 81, the electron beam is deflected at the deflector 13 by an angle of −β. The electron beam is further deflected at the deflector 14 by an angle of +β so that it is irradiated onto the substrate 10 vertically. Note that since, when the electron beam passes through a sub field relatively distant from the optical axis, the optical path length is greater than in a case in which the electron beam passes through a sub field in the vicinity of the optical axis, adjustment is made in a similar manner to that explained in reference to the first embodiment to ensure that the focal lengths of the magnetic lenses 80 and 81 will be increased by reducing the excitation currents.

Also in this embodiment as in the first embodiment, the electron beam is deflected by the deflectors 11 and 12 so that it passes through the axis of the magnetic lenses 80 and 81 resulting in a reduction in the effect of the lens aberration on the image projected on the substrate 10. In addition, the deflecting angles of the deflectors 11 and 14 are set equal to each other with their directions deflecting opposite each other, and the deflecting angle of the deflector 12 and the deflecting angle of the deflector 13 are set to be equal to each other with their directions deflecting opposite each other. Consequently, the deflection aberration of the deflector 11 and the deflection aberration of the deflector 14 cancel each other out. Likewise, the deflection aberration of the deflectors 12 and 13 cancel each other out so that it becomes possible to minimize the effect of deflection aberration in the projection image.

Moreover, there is an advantage achieved in that, compared to the apparatus shown in FIG. 1, in which the projection lens is constituted with a magnetic lens provided on one stage, the aberration of the magnetic lens can be reduced with two lenses. Note that, while the deflecting angles of the respective deflectors 11–14 are greater when two lenses are provided in comparison to when one lens is provided, and consequently, the deflection aberration also increases, by setting the deflecting angles as explained above, it is possible to minimize the effect of the deflection aberration.

Third Embodiment

Figure 4:
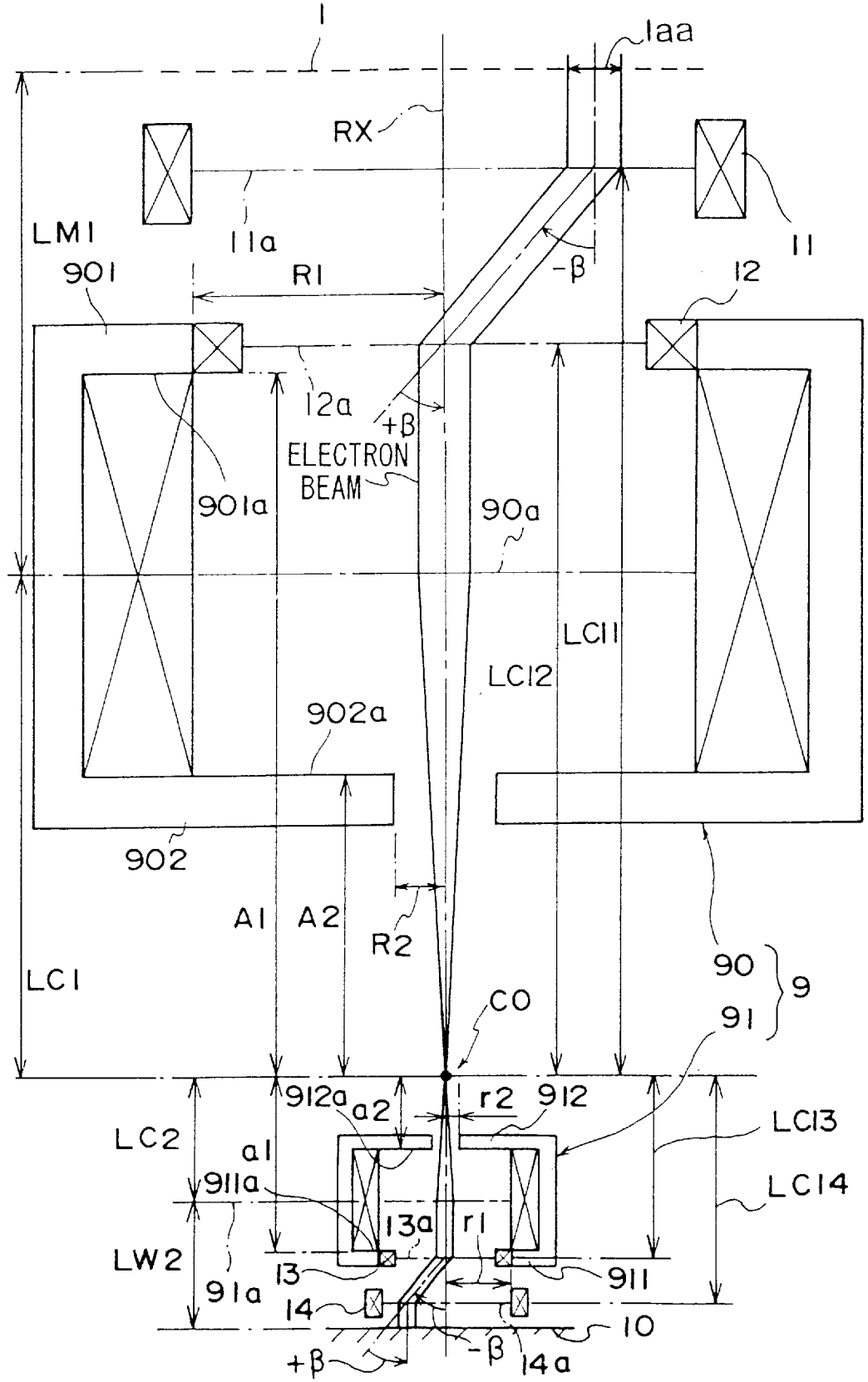
FIG. 4 illustrates a third embodiment of the charged particle beam projection apparatus according to the present invention.

FIG. 4 illustrates the third embodiment of the charged particle beam projection apparatus according to the present invention, with magnetic lenses 90 and 91 constituting a projection lens 9 satisfying the SMD requirements. Namely, when the distance between the principal plane 90a of the magnetic lens 90 and the mask 1 and the distance between the principal plane 90a and the crossover CO are respectively designated LM1 and LC1, the bore radii of the magnetic poles 901 and 902 are respectively designated R1 and R2, the distances between the crossover CO and the surface 901a of the crossover side magnetic pole 901 and the between the crossover and the surface 902a of the mask side magnetic pole 902 are respectively designated A1 and A2, all related to the magnetic lens 90, and the distances between the principal plane 91a of the magnetic lens 91 and the substrate 10 and between the principal plane 91a and the crossover CO are designated LW2 and LC2 respectively, the bore radii of the magnetic poles 911 and 912 are respectively designated r1 and r2 and the distances between the crossover CO and the surface 911a of the crossover side magnetic pole 911 and between the crossover CO and the surface 912a of the mask side magnetic pole 912 are designated a1 and a2 respectively, all related to the magnetic lens 91, the equations (1)–(3) explained earlier, i.e., $$LM1=LC1, LW2=LC2 \quad (1)$$

$$R1/r1=R2/r2=M \quad (2)$$

$$A1/a1=A2/a2=M \quad (3)$$

are satisfied, with the current at each coil set to ensure that the numbers of AT (ampere-turns) are equal to each other and the directions of their magnetic fields will be opposite from each other for the respective magnetic lenses 90 and 91. The other embodiments, i.e., the deflectors 11–14, are constituted identically to those in the apparatus shown in FIG. 3 with the same equations (4) and (7) being satisfied.

By constituting the projection lens 9 with the magnetic lenses 90 and 91 which satisfy the SMD requirements in this manner, the symmetry of the magnetic circuits at the magnetic lenses 90 and 91 improves and the lens aberration is reduced. Thus, compared to the apparatus shown in FIG. 3, the distortion of the projected image is reduced in this embodiment.

While, in reference to the first through third embodiments, examples in which a charged particle beam having passed through a sub field 1aa on the mask 1 is deflected by a first deflector to advance along the optical axis RX, travels through the projection lens and then is deflected by a second deflector in a direction that is opposite from the direction in which it has been deflected by the first deflector to be guided to a position on the substrate 10 that corresponds to the position of the sub field 1aa on the mask 1, have been explained, in reference to the following embodiments, i.e., fourth and fifth embodiments, examples of SMD that do not employ the deflectors described above are explained in reference to FIGS. 5 through 7.

Fourth Embodiment

Figure 5:
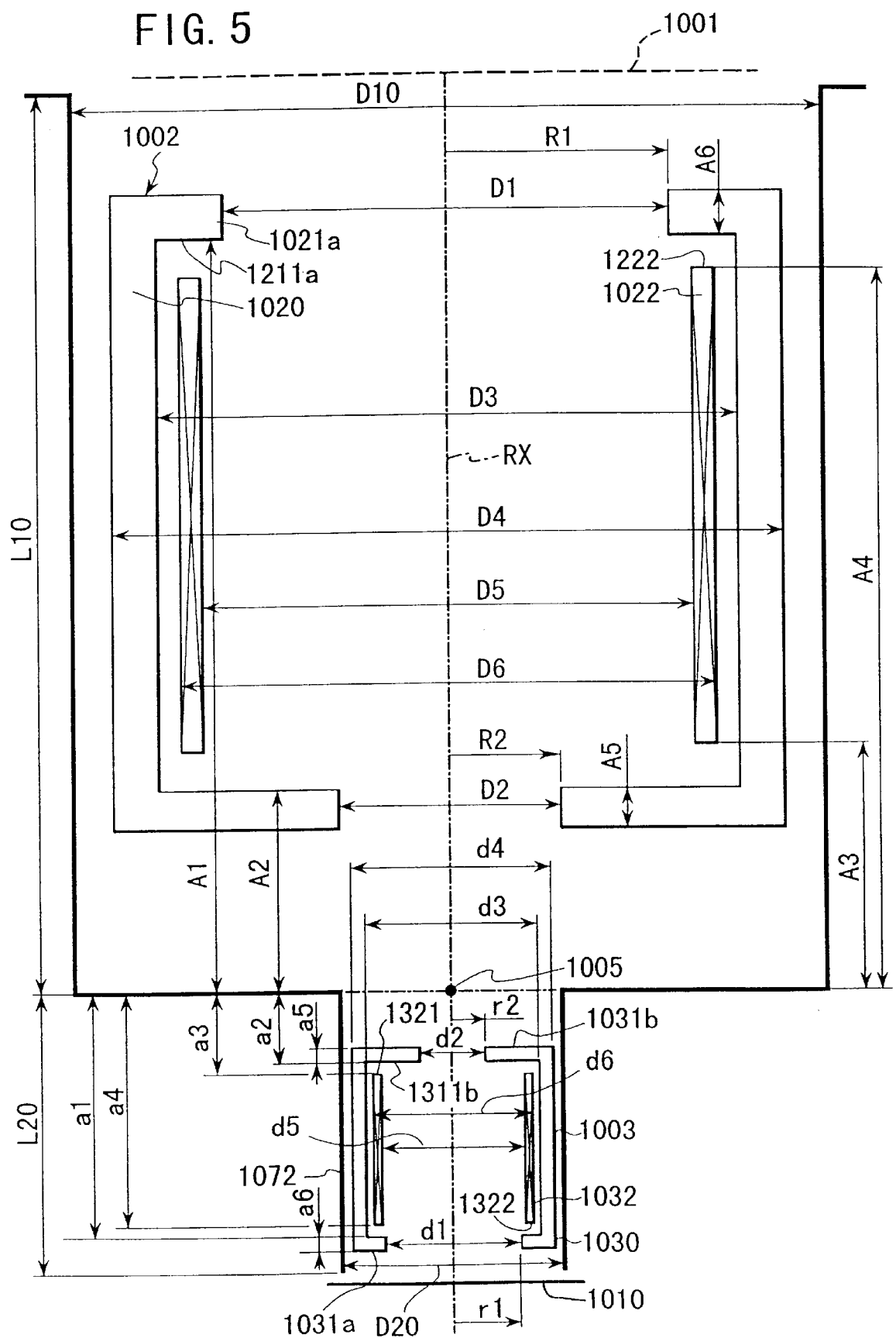
FIG. 5 is a cross section illustrating a fourth embodiment of the charged particle beam projection apparatus according to the present invention, showing the structure between a mask 1001 and a substrate 1010.
Figure 13:
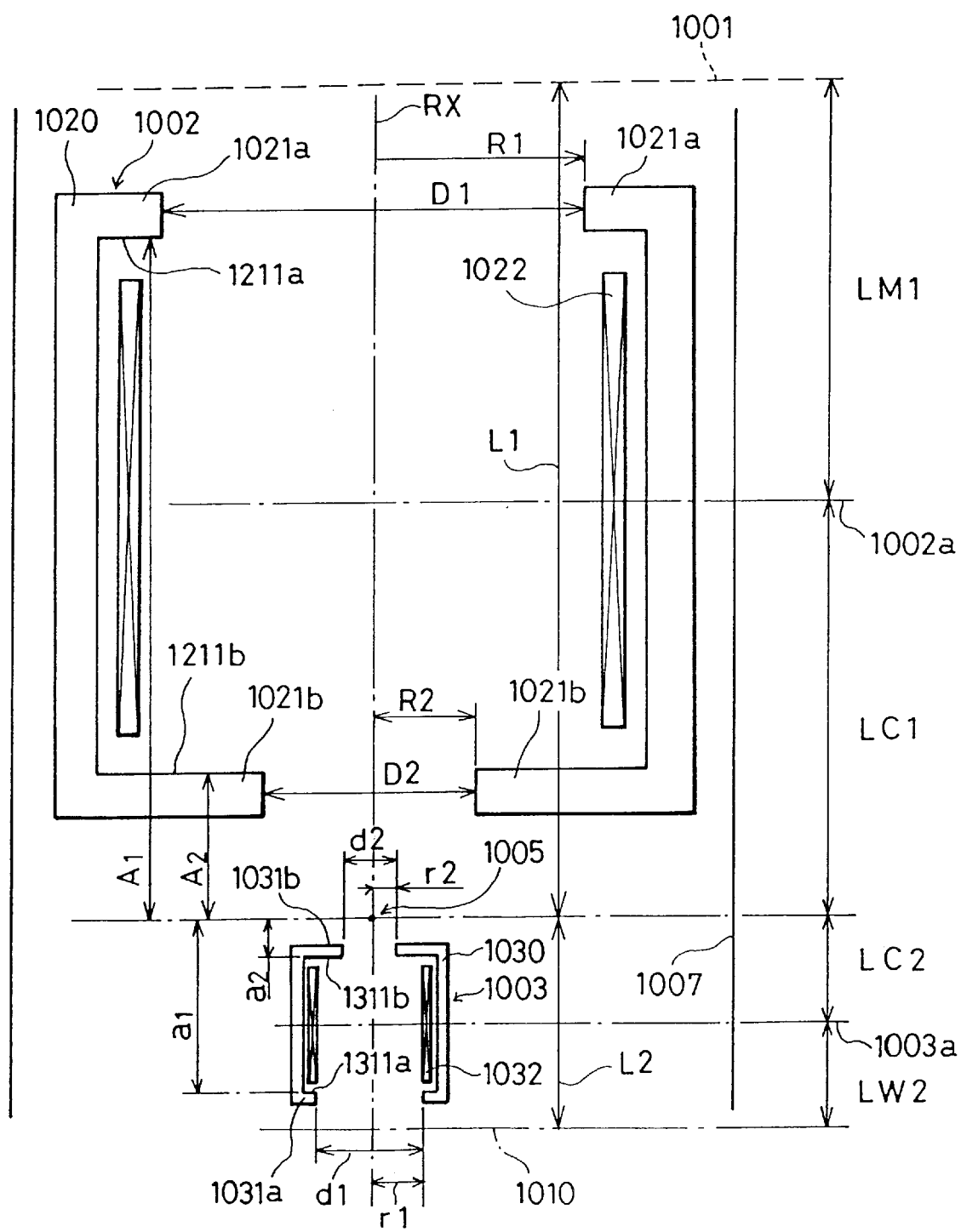
FIG. 13 illustrates a conventional charged particle beam projection apparatus showing the structure between the mask and the substrate.

FIG. 5 is a cross section showing the fourth embodiment of the charged particle beam projection apparatus according to the present invention, which illustrates the structure of the apparatus between a mask 1001 and a substrate 1010, as in the case in FIG. 13. In the apparatus in this embodiment, in addition to the requirements imposed upon the mask side magnetic lens 1002 and the substrate side magnetic lens 1003 in the known art, i.e., the SMD requirements expressed with the equations (1)–(3) mentioned above being satisfied and the requirements that are the same as those imposed upon the apparatus shown in FIG. 13, i.e., that the absolute values of the numbers of AT in the mask side magnetic lens 1002 and the substrate side magnetic lens 1003 are equal to each other and that the directions of the currents running through their coils are opposite from each other being satisfied, the following requirements in regard to the various dimensions of a lens casing 1020 and a coil 1022 of the magnetic lens 1002 and a lens casing 1030 and coil 1032 of the magnetic lens 1003 are satisfied.

Namely, in FIG. 5, between the dimensions related to the mask side magnetic lens 1002 (the lens casing inner diameter D3, the lens casing outer diameter D4, the coil inner diameter D5, the coil outer diameter D6, the distance A3 from the crossover 1005 to the surface 1221 of the crossover side coil 1022, the distance A4 from the crossover 1005 to the surface 1222 of the mask side coil 1022, the thickness A5 of a crossover side magnetic pole 1021b and the thickness A6 of a mask side magnetic pole 1021a) and the dimensions related to the substrate side magnetic lens 1003 (the lens casing inner diameter d3, the lens casing outer diameter d4, the coil inner diameter d5, the coil outer diameter d6, the distance a3 from the crossover 1005 to the surface 1321 of the crossover side coil 1032, the distance a4 from the crossover 1005 to the surface 1322 of the substrate side coil 1032, the thickness a5 of a crossover side magnetic pole 1031b and the thickness a6 of a substrate side magnetic pole 1031a), the following equations $$D3=M \cdot d3, \ D4=M \cdot d4, \ D5=M \cdot d5, \ D6=M \cdot 6 \tag{8}$$

and, $$D3=M \cdot a3, \ A4=M \cdot a4, \ A5=M \cdot a5, \ A6=M \cdot a6 \tag{9}$$

By making the settings to ensure this, the distortion are satisfied. of the image formed on the substrate 1010 can be reduced to almost 0.

Next, a specific example with the reduction rate at 1/4 is explained. The respective dimensions described above are all set at $$D1=D5=160, \ D2=40, \ D3=D6=280, \ D4=400 \tag{10}$$

$$A1=A4=360, \ A2=A3=40, \ A5=20, \ A6=40 \tag{11}$$

$$d1=d5=40, \ d2=10, \ d3=d6=70, \ d4=100 \tag{12}$$

$$a1=a4=90, \ a2=a3=10, \ a5=5, \ a6=10 \tag{13}$$

and since these values satisfy all the equations in (8) and (9), a distortion of almost 0 is achieved. Note that the units used here are millimeters.

Figure 6:
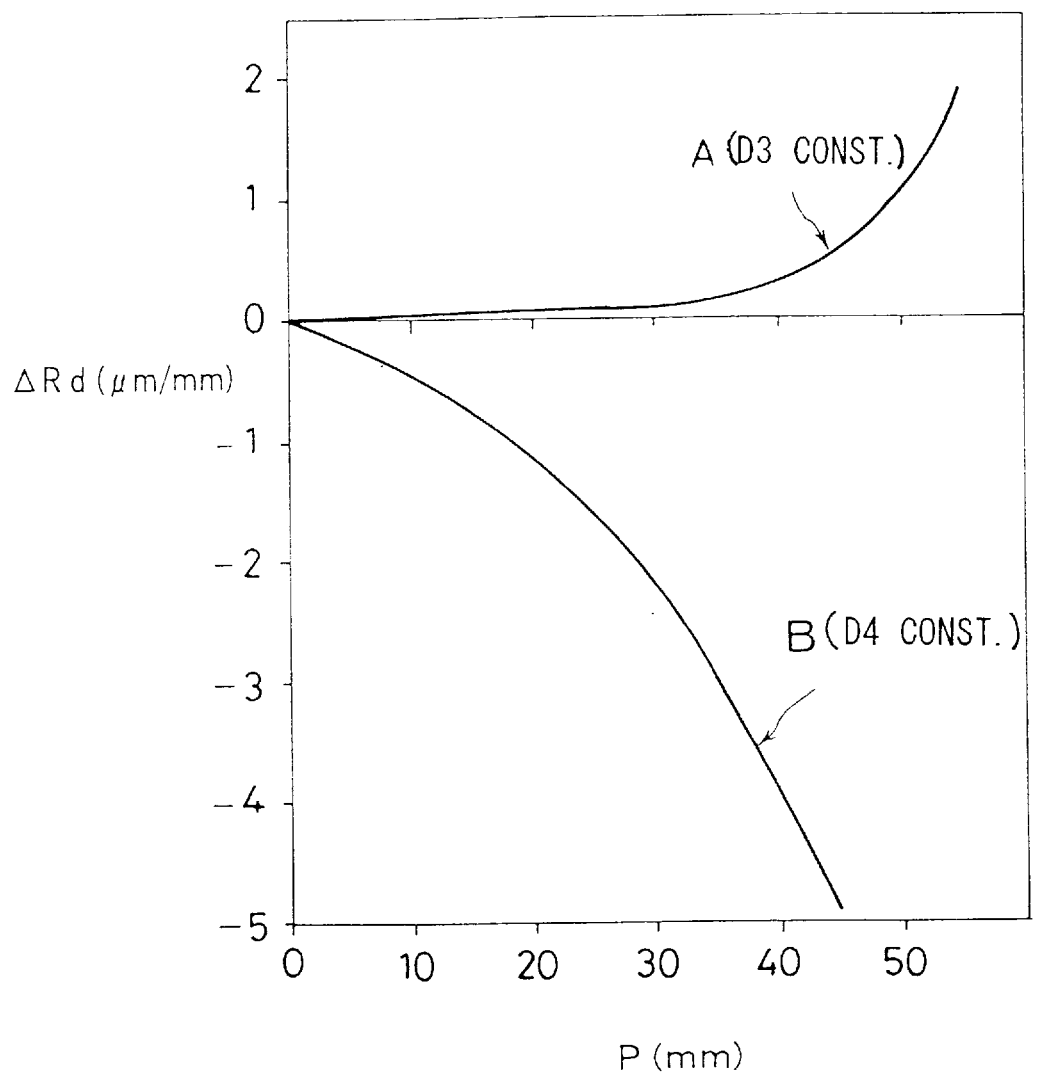
FIG. 6 shows changes in the isotropic distortions per 1 mm of sub field ($\Delta Rd \mu m/mm$) as a function of the inner or outer diameter of the lens casing reducing factor P(mm) for the mask side magnetic lens 1002, showing case A where outer diameter $D_4$ is reduced by P(mm) while the inner diameter $D_3$ is constant, and showing case B where the inner diameter $D_3$ is reduced by P(mm) while outer diameter $D_4$ is constant.

Next, an explanation is given of a distortion occurring when some of the equations given in (8) and (9) are not satisfied by using an example. FIG. 6 is a graph showing changes in the isotropic distortion per 1 mm of sub field ΔRd (μm/mm) of the image formed on the substrate 1010, obtained through computer simulation as the lens casing inner diameter D3 (D6=D3) and the lens casing outer diameter D4 are reduced by P(mm) independently of each other in the mask side magnetic lens 1002 with its dimensions as given in the numerical equations (10) and (11). The horizontal axis represents the reduction quantity P(mm) of either the lens casing inner diameter D3 or the lens casing outer diameter D4, and the vertical axis represents the isotropic distortion per 1 mm of sub field ΔRd(mm). Curve A represents the changes in the distortion ΔRd that occur as the lens casing outer diameter D4 is reduced with the lens casing inner diameter D3 set at 280 (mm) whereas curve B represents changes in the distortion ΔRd which occur as the lens casing inner diameter D3 is reduced with the lens casing outer diameter D4 at set 400 (mm).

As curve A in FIG. 6 clearly indicates, as the lens casing outer diameter D4 is reduced with the lens casing inner diameter D3 set at a constant value, the distortion ΔRd is positive and its absolute value gradually increases. Also, as curve B indicates, as the lens casing inner diameter D3 is reduced with the lens casing outer diameter D4 set at a constant value, the distortion ΔRd is negative and its absolute value gradually increases. It is clearly indicated that when the lens casing inner diameters D3 and d3 and the lens casing outer diameters D4 and d4 satisfy the symmetry expressed in numerical equations (8), i.e., when all 8 of the equations presented in the numerical equations (8) and (9) are satisfied, the distortion ΔRd is equal to 0.

In addition to the explanation given above, again in reference to FIG. 5, an explanation is given on the distortion related to the shape of a magnetic shield 1007. The magnetic shield 1007 is provided with a shielding portion 1071 that shields the mask side magnetic lens 1002 and a shielding portion 1072 that shields the substrate side magnetic lens 1003 with the boundary at the crossover 1005, and between the diameters D10 and D20 of the shielding portions 1071 and 1072 respectively and between the lengths L10 and L20 of the shielding portion 1071 and the shielding portion 1072 in the direction of the optical axis respectively, the relationships expressed in $$D10=M \cdot D20, \ L10=M \cdot L20 \tag{14}$$

are satisfied. In other words, settings are made to ensure that the symmetry that is achieved in regard to the mask side magnetic lens 1002 and the substrate side magnetic lens 1003 is also achieved in regard to the electromagnetic shield 1007. By giving the magnetic shield 1007 such symmetry in this manner, it is possible to reduce the lens distortion caused by the magnetic shield 1007.

Moreover, the influence of the magnetic shield 1007 may also be reduced by setting its form as described below. Namely, in a magnetic shield shaped cylindrically, the relationship between its diameter D20 and the outer diameter of the mask side magnetic lens 1002, (i.e., the lens casing outer diameter D4) is required to satisfy the following expression (15)

$$D20>4 \cdot D4. \tag{15}$$

As has been explained, in the fourth embodiment, since, when the reduction rate in the charged particle beam projection apparatus is set at 1/M, other dimensions of the magnetic lenses 1002 and 1003 (the lens casing inner diameters, outer diameters and the like, for instance) are set to have a symmetry of M:1 as expressed in the equations (8) and (9), as well as the bore diameters D1, D2, d1 and d2 of the magnetic poles 1021a, 1021b, 1031a and 1031b respectively and the lens gaps A1, A2, a1 and a2, as in the known art, the degree of symmetry at M:1 related to the magnetic circuit becomes further improved, which, in turn makes it possible to reduce the distortion of the image formed on the substrate 1010 almost to 0. Furthermore, by ensuring that the equation (14) or (15) is satisfied in regard to the magnetic shield 1007, it is possible to reduce the distortion of the image caused by the magnetic shield 1007.

Note that, while in a conventional charged particle beam projection apparatus, as shown in FIG. 13, it is considered necessary to position the principal plane 1002a of the mask side magnetic lens 1002 at the middle point between the mask 1001 and the crossover 1005 and to position the principal plane 1003a of the substrate side magnetic lens 1003 at the middle point between the crossover 1005 and the substrate 1010, these positional requirements do not necessarily have to be satisfied if the angle of incident beam on the substrate does not have to be 90 degs.

Fifth Embodiment

If any of the eight equations included in the numerical equations (8) and (9) presented in reference to the fourth embodiment described above is not satisfied, the magnetic circuit becomes asymmetrical, resulting in a distortion in the image formed on the substrate. According to computer simulations, the magnitude of this distortion is at its highest when the relationship between D3 and d3 becomes unbalanced (i.e., when the D3≠d3), and at the second highest when the relationship between the D4 and d4 becomes unbalanced, with the magnitude becoming lower as the relationships between A5 and a5, between A6 and a6, between D5 and d5, between D6 and d6, between A3 and a3 and between A4 and a4 become unbalanced in that order. However, since at least one of the eight equations is satisfied, the symmetry of M:1 is established in regard to the more detailed dimensions of the magnetic lenses 1002 and 1003 compared to that of conventional ones, resulting in a higher degree of symmetry at M:1 in regard to the magnetic circuit, a reduced distortion of the image formed on the substrate 1010 compared to the conventional ones is achieved.

Ideally, in a charged particle beam projection apparatus, the distortion should be at 0. However, in reality, the required accuracy in regard to the distortion varies depending upon the application. As explained earlier, the magnitude of distortion varies depending upon in which dimensional relationship the symmetry becomes unbalanced between the magnetic lenses 1002 and 1003. In this embodiment, through numerical analysis, in which dimensional relationship the symmetry should be assured is determined in correspondence with the required accuracy in different cases, and by ensuring that at least one of the equations presented in the numerical equations (8) and (9) is satisfied, the required accuracy can be achieved. In other words, since the apparatus may be produced with a high degree of accuracy only in regard to the minimum portions where such accuracy is required, it is possible to reduce the production cost while ensuring the required accuracy.

Sixth Embodiment

In a charged particle beam projection apparatus, when the reduction rate 1/M approaches 0, at ¼ or ¹/₁₀, for instance, a problem arises in that the outer diameter D4 of the mask side magnetic lens 1002 is increased, resulting in a larger apparatus. Now, as indicated with curves A and B in FIG. 6, the distortion ΔRd occurring when the lens casing inner diameter D3 is reduced and the distortion ΔRd occurring when the lens casing outer diameter D4 is reduced have signs reversed from each other. This means that the distortion occurring when the lens casing inner diameter D3 is smaller by ε (ε being a positive real number) than D3=M·d3 presented in numerical equations (8), i.e., the distortion occurring when D3=M·d3−ε, can be reduced by setting the lens casing outer diameter D4 in such a manner that D4=M·d3 −β is satisfied. Since the absolute value of the distortion accompanying the change in the lens casing inner diameter D3 is larger than the absolute value of the distortion resulting from the change in the lens casing outer diameter D4, β used in the equation should be a real number which satisfies β>ε.

Figure 7:
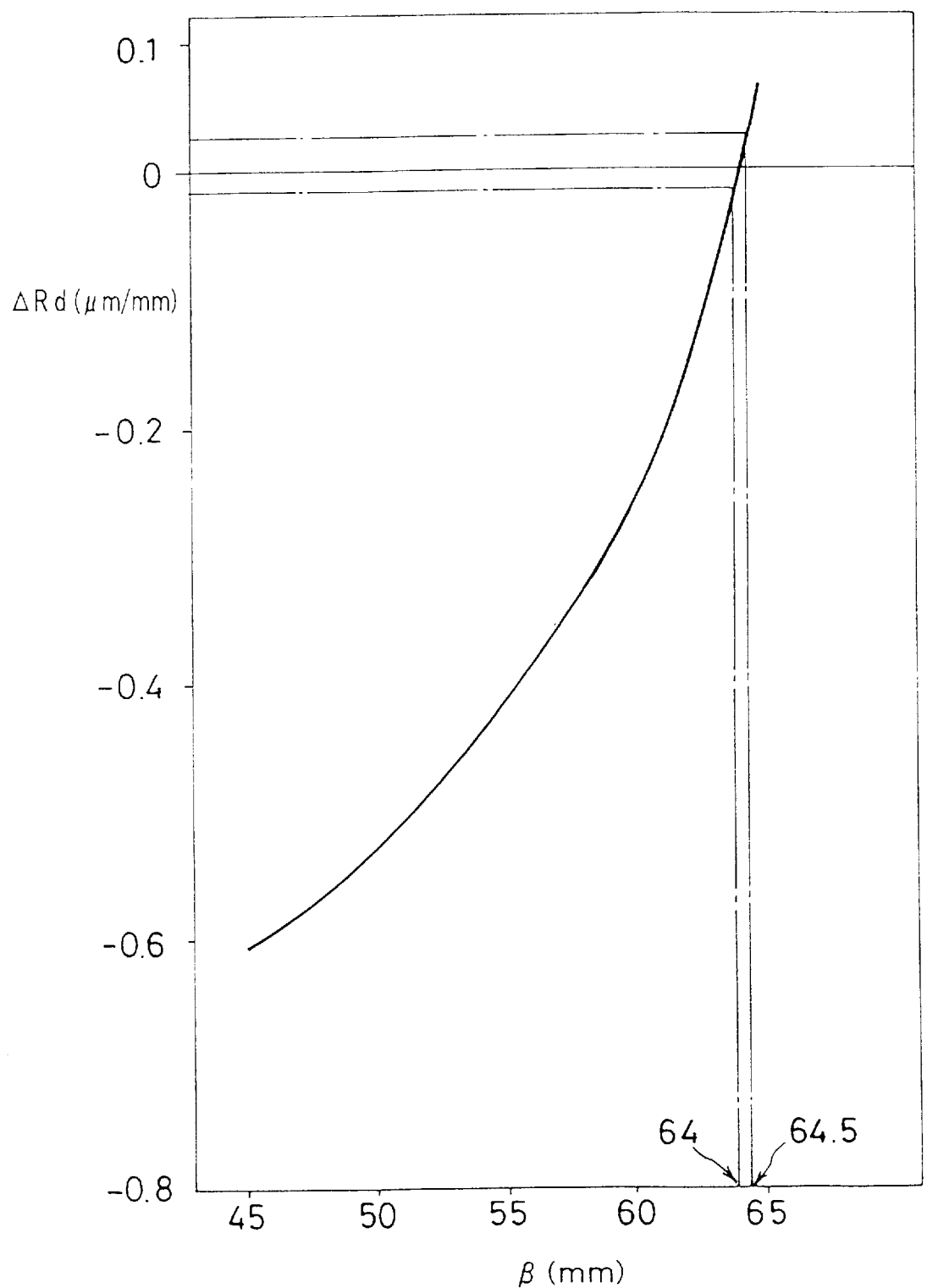
FIG. 7 shows compensation for the isotropic distortion per 1 mm of sub field as a function of the lens casing outer diameter reduction factor $\beta$, where the lens casing inner diameter $D_3$ is constant.

FIG. 7, which presents a specific example of this, shows the distortion ΔRd occurring as the lens casing inner diameter D3 and the lens casing outer diameter D4 of the mask side magnetic lens 1002, which has the dimensions presented in the numerical equations (10) and (11), are satisfied and, in particular, it shows the distortion ΔRd occurring as the lens casing outer diameter D4 is reduced with ε at 30(mm). As the figure clearly indicates, the distortion ΔRd =0 is achieved between β=64 (mm) and β=64.5(mm). In other words, ΔRd =0 may be achieved even when all the requirements expressed in the numerical equations (8) and (9) are not met.

Thus, in regard to the mask side magnetic lens 1002, even when the equations D3=M·d3 and D4=M·d4 related to the lens casing inner diameter d3 and the lens casing outer diameter D4 of the substrate side magnetic lens 1003 are not satisfied, the distortion ΔRd may be reduced by setting the lens casing inner diameter D3 and the lens casing outer diameter D4 at D3=M·d3−ε and at D4=M·d3−β respectively. As a result, when the lens casing inner diameter D3 and the lens casing outer diameter D4 of the mask side magnetic lens 1002 are set at those dimensions, an advantage is achieved in that even at the same reduction rate, the outer diameter D4 of the mask side magnetic lens 1002 can be reduced. Note that specific values for ε and β are determined as appropriate in correspondence to the required accuracy.

As has been explained, in this embodiment, since, when the reduction rate 1/M is small, at ¼ or ¹/₁₀, for instance, resulting in that the lens casing outer diameter D4 of the mask side magnetic lens 1002 becomes excessively large, the distortion of the image can be reduced significantly, perhaps even to 0 by setting the lens casing inner diameter D3 and the lens casing outer diameter D4 at D3=M d3−ε and at D4=M·d4−β respectively, miniaturization of the charged particle beam projection apparatus can be achieved.

In reference to the charged particle beam projection apparatuses in the first through sixth embodiments described so far, an explanation has been given on a reduction of the aberration caused by the magnetic lens and the deflection aberration caused by the deflectors provided both at the mask side magnetic lens and at substrate side magnetic lens, and a reduction of the aberration caused by the magnetic lenses achieved by ensuring that the dimensional relationships among the elements constituting the magnetic lenses employing the SMD method are set at a specific ratio in correspondence to the reduction rate 1/M.

With the charged particle beam projection apparatuses in the embodiments described above, while the aberration caused by the magnetic lenses or the deflectors can be corrected satisfactorily, it may still be necessary to reduce the aberration further depending upon the level of integration of the pattern to be projected. In particular, although the aberration in the sub fields in the vicinity of the optical axis is small enough to be insignificant, there are some sub fields among the plurality of sub fields that are present at positions relatively distant from the optical axis in the non-scanning direction since each of the main fields extends over a long range in the non-scanning direction. When projecting the patterns in the sub fields which are thus distant from the optical axis to corresponding positions on the substrate, the distortion caused by deflection distortion of the deflectors, the aberration in the projection lens system and the like, may be superimposed on the image projected by the image forming lens system and, as a result, it also becomes necessary to correct such distortion.

In addition, an electron beam delineation system which adopts a method in which an electron beam whose cross sectional shape is variable is scanned on a substrate is also in use for forming circuit patterns on a substrate such as a wafer, as in the case of a charged particle beam projection apparatus. In such an electron beam delineation system, a mask on which various basic patterns (corresponding to sub fields) are formed is used and a desired pattern is drawn on a substrate by deflecting an electron beam that has passed through a selected basic pattern on the mask in two directions which run perpendicular to each other (referred to as direction X and direction Y). Consequently, since the deflection distortion of the electron beam may cause a pattern error, correction is performed by approximating the deflection distortion with a polynomial of the drive signal in the conventional art. In such a case, correction numerical expressions for correcting the deflection distortion in direction X and in direction Y are determined in advance as functions of the drive signal for each of the basic patterns on the mask, for instance, and by using these correction numerical expressions, correction of the deflection distortion is performed respectively for each of the basic patterns on the mask.

However, in the electron beam delineation system described above, the area exposed at one time is small, at only several μm square or less and no consideration whatsoever is made regarding deflection distortion occurring inside the area.

Moreover, in a mask employed in the partitioned projection method, boundary areas (non-pattern areas) are formed between adjacent sub fields for blocking the electron beams or for diffusing the electron beams in order to prevent interference among electron beams from adjacent sub fields on the mask. Consequently, since the images in the respective sub fields to be projected onto the substrate are connected with one another in contact, it is necessary to move the images in the sub fields by a distance that corresponds to the width of the boundary areas via a deflector when projecting patterns in the respective sub fields onto the substrate. Since this distance over which such movement is made is in proportion to the number of boundary areas counting from a straight line running parallel to the scanning direction which also passes through the optical axis, the distance over which such a deflection movement is required to be made increases for sub fields that are further away from the optical axis. Normally, the quantity of deflection imparted by a deflector is expressed as a product of the deflection sensitivity and the magnitude of the drive signal provided to the deflector, with the latter value, i.e., the drive signal quantity set in correspondence to the distance of the pattern to be projected from the optical axis. However, the projection positions of the images on the substrate will deviate from the positions they should be, necessitating that calibration of the drive signal quantity be performed in one way or another, even if a drive signal that corresponds to the distances of the sub field from the optical axis is simply provided to the deflector, as there are boundary areas present among adjacent sub fields as explained above.

Seventh Embodiment

In regard to the problems described above, a seventh embodiment according to the present invention is described in reference to FIGS. 8–11.

Figure 8:
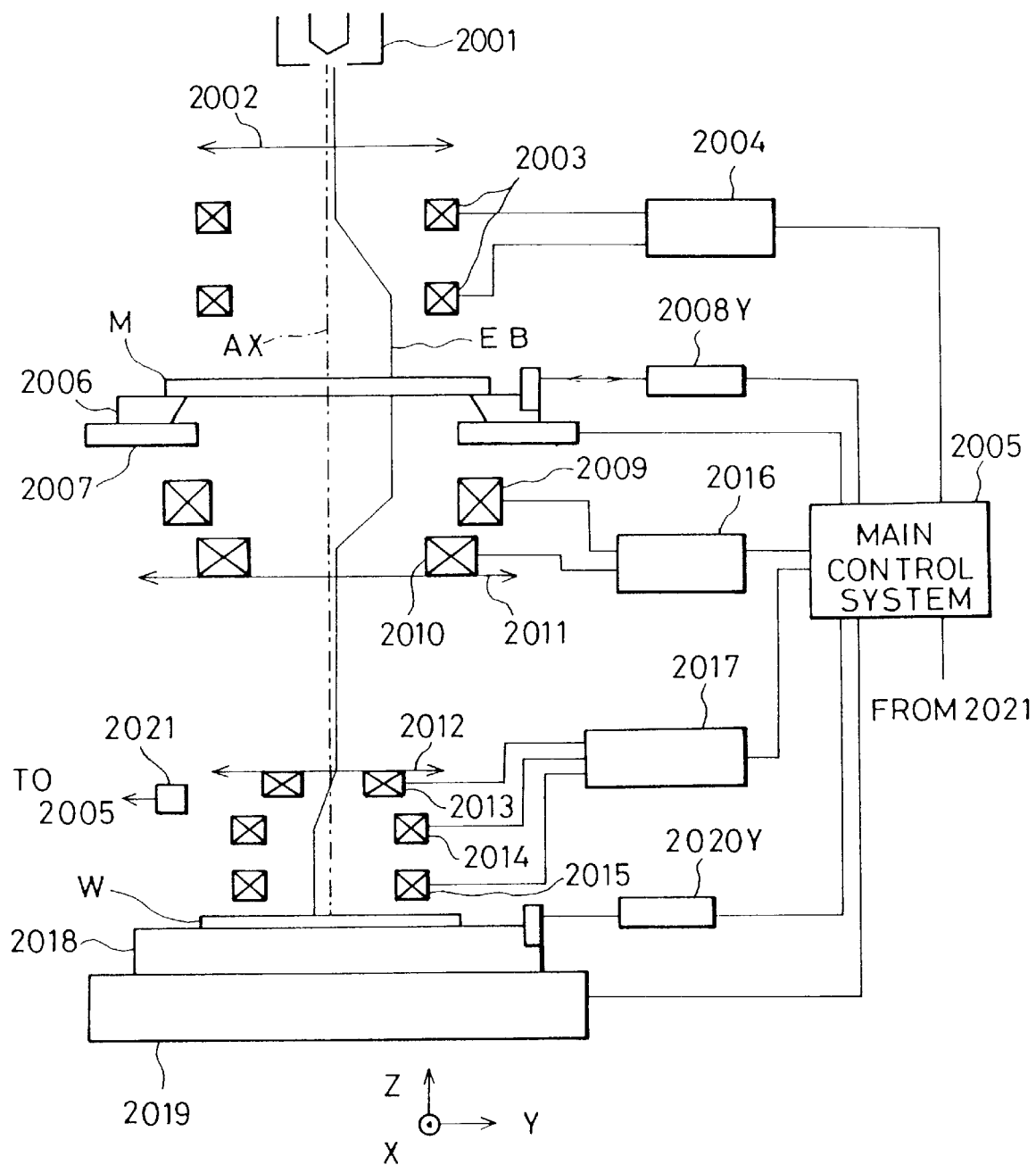
FIG. 8 is a block diagram of a charged particle beam projection apparatus employed in one of the embodiments according to the present invention.
Figure 9:
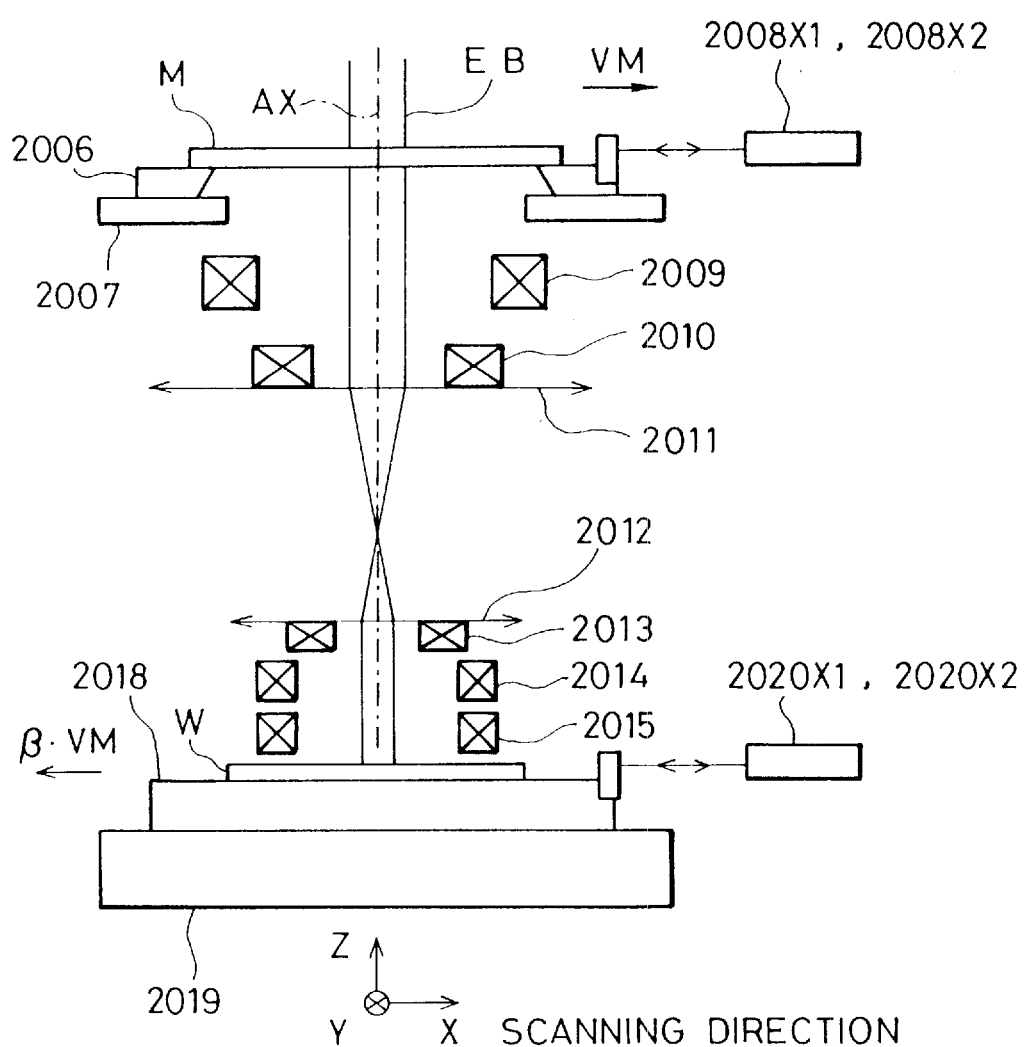
FIG. 9 is a side elevation of the charged particle beam projection apparatus shown in FIG. 8 viewed from direction Y.

FIG. 8 shows the charged particle beam apparatus employed in this embodiment and FIG. 9 is a side elevation of the charged particle beam projection apparatus shown in FIG. 8, viewed from direction Y. In FIG. 8, and electron beam EB which is emitted from an electron gun 2001, after being converted to a parallel beam at a condenser lens 2002, is deflected by a sub field selecting deflector 2003 to be induced to a selected sub field which is to be detailed later, selected from among the pattern areas of a mask M. The following explanation is given with the Z axis taken in a direction parallel to the optical axis AX of the electron optical system, the X axis taken in the direction perpendicular to the surface of the paper upon which FIG. 8 is presented within a plane vertical to the Z axis and the Y axis taken in a direction parallel to the surface of the paper on which FIG. 8 is presented. In this case, the field selecting deflector 2003 deflects the electron beam EB in direction X and in direction Y on the mask M in response to a drive signal sent from a deflection quantity setting unit 2004 which is controlled by a main control system 2005 that controls the entire apparatus.

The mask M is held on a mask stage 2006 and the mask stage 2006 moves (scans) the mask M in direction X continuously on a mask base 2007. In addition, the mask stage 2006 is capable of moving the mask M in direction Y. The coordinate of the mask stage 2006 in direction Y is measured by a laser interferometer 8Y and the coordinates at 2 locations in direction X are measured by laser interferometers 8X1 and 8X2 (see FIG. 9). These measured values are transferred to the main control system 2005. With these values measured over the three axes, the X coordinate, the Y coordinate and the rotating angle (yaw) of the mask stage 2006 are constantly obtained and, based upon these coordinates and the like, the main control system 2005 controls the operation of the mask stage 2006.

The electron beam EB after having been transmitted through one of the sub fields of the mask M is deflected by a first main deflector 2009 and a first sub deflector 2010 so that it travels along the optical axis AX, and as it is converged via a first projection lens 2011 and a second projection lens 2012 constituted with magnetic lenses, it is deflected by a second main deflector 2013, a second sub deflector 2014 and a deflector for positional correction 2015 to project an inverted and reduced image of the pattern within the sub field onto the corresponding sub projection area on a wafer W, upon which an electron beam resist has been applied. The projection magnification β at which images are projected from the mask M onto the wafer W may be, for instance ¼. The main control system 2005 sets the quantities of deflection of the electron beam imparted by the first main deflector 2009 and the first sub deflector 2010 via a deflection quantity setting unit 2016, and also sets the quantities of deflection of the electron beam imparted by the second main deflector 2013, the second sub deflector 2014 and the deflector for positional correction 2015 via a deflection quantity setting unit 2017. The deflector for positional correction 2015 is employed to correct the distortion in the first projection lens 2011 and the second projection lens 2012, and to correct the synchronization errors between the mask stage 2006 and the wafer platform 2018 or the like. Either electromagnetic deflectors or electrostatic detectors may be used for these deflectors.

The wafer W is held on a wafer platform 2018 with the wafer platform 2018 secured onto an XY stage 2019. The XY stage 2019 continuously moves (scans) the wafer platform 2018 in direction X while direction Y is scanned in steps.

The coordinate of the wafer platform 2018 in direction Y is measured by a laser interferometer 2020Y and the coordinates at the two locations in direction X are measured by laser interferometers 2020 X1 and 2020 X2 (see FIG. 9). Those values thus measured are transferred to the main control system 2005. With these measured values over the three axes, the X coordinate, Y coordinate and the rotating angle of the wafer platform 2018 are constantly obtained and, based upon these coordinates and the like, the main control system 2005 controls the operation of the XY stage 2019.

In addition, a reflected electron detector 2021 is provided diagonally above the wafer W and a detection signal from the reflected electron detector 2021 is transferred to the main control system 2005. The backscattered electron detector 2021 in this embodiment is employed for detecting the degree of the misalignment between the image of a specific mark provided on the mask and a corresponding mark on the wafer platform 2018 in direction X and in direction Y.

Note that, since it is difficult to reduce the aberration with only the projection lens system, the aberration is reduced by combining the first main and sub deflectors and the second main and sub deflectors. The deflection to cause the non-pattern areas between the adjacent sub fields on the mask is performed by superimposing two deflecting currents at the same level onto the first main deflector and the first sub deflector. In other words, two types of deflections are imparted to the first main and sub deflectors; a deflection for reducing the aberration in the lens and a deflection for causing the non-pattern areas between the adjacent sub fields on the mask.

In FIG. 9, the electron beam EB is irradiated on the pattern in one sub field on the mask M, and the pattern in the sub field is projected on to the wafer W via the first projection lens 2011 and the second projection lens 2012. In addition, the first main deflector 2009, the first sub deflector 2010, the second main deflector 2013 and the second sub deflector 2014 are capable of deflecting the electron beam EB in both positive and negative directions along X axis on over a width equivalent to approximately 1 sub field on the mask M respectively, and the deflector for positional correction 2015 imparts a similar effect on the electron beam EB also in direction X as that imparted in direction Y.

When projecting a pattern on the mask M onto a projection area which corresponds to one die (semiconductor chip) on the wafer W in the partitioned projection method, the patterns extending in direction Y on the mask M are sequentially projected on to the wafer W by deflecting the electron beam EB in direction Y as shown in FIG. 8 and also, in synchronization with the scanning of the mask M in direction +X (or in direction −X) at a speed VM, the wafer W is scanned in direction −X (or in direction +X) at a speed of approximately β·VM. As explained earlier, β represents the projection magnification and the scanning direction of the mask M and the scanning direction of the wafer W are the reverse of each other since a reverse image is projected onto the wafer W. While the explanation so far has been given on the structure of the charged particle beam projection apparatus, the mask M and the wafer W used in this apparatus are explained now.

Figure 10A:
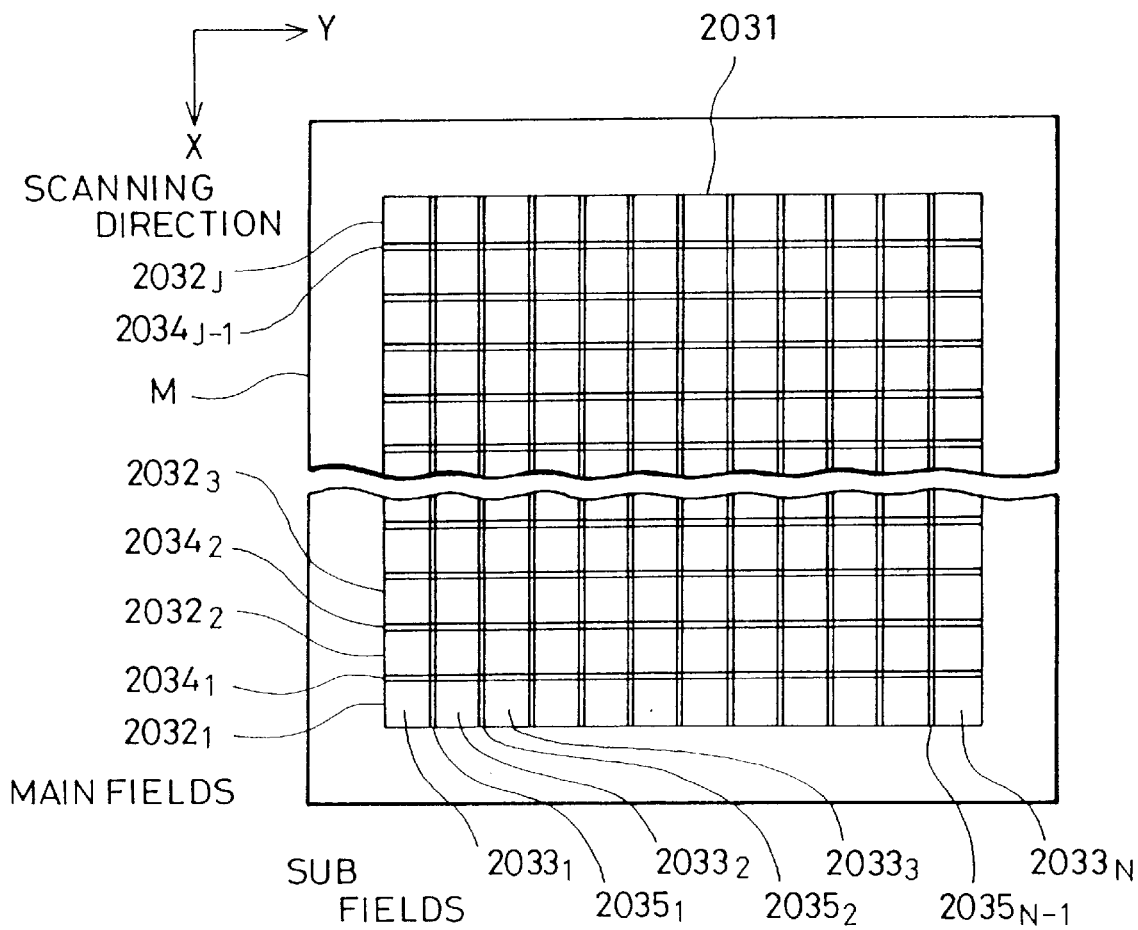
FIG. 10A is a plan view showing an example of a pattern arrangement of a mask to be projected through the partitioned projection method with a portion of it omitted.

FIG. 10A shows an example of the mask M which constitutes the object of projection and in this figure, a pattern area 2031 of the mask M is partitioned into main fields $2032_1, 2032_2 \ldots, 2032_J$ whose widths are constant in direction X (scanning direction) and each main field is partitioned into sub fields $2033_1, 2033_2 \ldots, 2033_N$ (both J and N are integers at 2 or higher) whose widths are constant in direction Y (non-scanning direction and in the direction of the beam deflection), with the pattern for projection formed within each of the sub fields $2033_n$ (n=1−N). The electron beam EB from the electron gun 2001 shown in FIG. 8 is irradiated onto one sub field selected in the pattern area 2031. In addition, the adjacent main fields $2032_1$, $2032_2, \ldots, 2032_j$ are each partitioned by boundary areas (non-pattern areas) $2034_1, 2034_2, \ldots, 2034_{J-1}$ respectively, whose width are constant for absorbing the electron beam or for scattering the electron beam. Likewise, the adjacent sub fields $2033_1, 2033_2, \ldots 2033_N$ are each partitioned by boundary areas (non-pattern areas) $2035_1, 2035_2, \ldots, 2035_{N-1}$ whose widths are constant, for absorbing or scattering the electron beam. This ensures that no interference occurs among the patterns projected in adjacent sub fields when projecting the patterns in the respective sub fields sequentially onto the wafer W.

A so-called scattering mask, in which a transmission portion for electron beams is constituted with a thin film such as silicon nitride (SiN) or the like and a thin film constituted of tungsten or the like provided at the surface of the first thin film constitutes a scatter portion, a so-called perforated stencil mask in which holes provided in the scattering substrate constituted of silicon are used as transmission portion to be employed as a mask M for electron beams and the like, exist in the known art and any of these may be used in this embodiment.

Figure 10B:
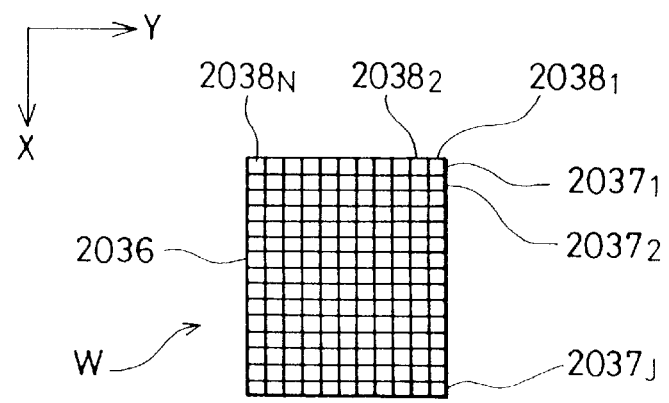
FIG. 10B is a plan view showing one projection area on a wafer, onto which projection is performed through the partitioned projection method.

In FIG. 10B, which shows one projection area 2036 which corresponds to one die on the wafer W, the projection area 2036 is partitioned into main projection areas $2037_1$, $2037_2, \ldots, 2037_j$ at a specific pitch in direction X and each of the main projection areas is partitioned into sub projection areas $2038_1, 2038_2, \ldots, 2038_N$ at a specific pitch in direction Y respectively. The pattern in the main fields $2032_1$, $2032_2, \ldots, 2032_j$ on the mask M are reduced and respectively projected onto the main projection areas $2037_1, 2037_2$, $\ldots, 2037_J$ on the wafer W and in each main projection area, the patterns in the sub fields $2033_1, 2033_2, \ldots, 2033_N$, on the mask M are reduced and respectively projected onto the sub projection areas $2038_1, 2038_2, \ldots, 2038_N$, for instance. In this case, the patterns in the sub fields $2033_1, 2033_2, \ldots, 2033_N$ are projected while laterally shifted in direction Y on the wafer W by a distance corresponding to the product of the projection magnification and the total widths of the boundary areas (non-pattern areas) $2035_1, 2035_2, \ldots,$ $2035_{N-1}$ which are present between the respective sub fields and the optical axis AX, so that the sub projection areas $2038_1, 2038_2, \ldots, 2037_N$ on the wafer W are connected in contact in direction Y. In addition, the main projection areas $2037_1, 2037_2, \ldots, 2037_J$ on the wafer W are also connected in contact in direction X. Thus, the ratio of the scanning speed for the mask M and the scanning speed for the wafer W is not necessarily equal to the projection magnification β and is set at a value which takes into consideration the shift caused by the boundary areas $2034_1, 2034_2, \ldots, 2034_{J-1}$ on the mask M.

Note that if, for instance, identical patterns are present in a plurality of sub projection areas at varying positions on the wafer W, by incorporating the plurality of sub fields on the mask M which correspond to the sub projection areas into one sub field, the number of patterns on the mask M can be reduced to achieve a smaller mask. When the number of patterns on the mask M is reduced in this manner, the pattern in the sub field $2033_1$ in FIG. 10A, for instance, is not necessarily projected in the sub projection area $2038_1$ on the wafer W, and the quantity of deflection to be imparted to the electron beam which has passed through each of the sub fields $2033_1 \sim 2033_N$ varies depending upon in which projection area on the wafer the image is to be projected and the quantity of deflection for each may be set at an arbitrary value between the maximum and the minimum values.

In FIG. 8, a projection data storage device (not shown) which is connected to the main control system 2005, provides projection data such as the pattern structure on the mask M, which constitutes the object of projection, and information on the arrangement of the plurality of projection areas on the wafer W to the main control system 2005. Based upon these projection data, the main control system 2005 controls the quantities of deflection of the electron beam EB in direction X and direction Y via the deflection quantity setting units 2004, 2016 and 2017. Also, by controlling the positions and the moving speeds of the mask stage 2006 and the wafer platform 2018 on the wafer side, projects the target pattern in each projection area on the wafer W.

At this point, as shown in FIG. 10A, since each of the main fields $2032_1 \sim 2032_J$ on the mask M is elongated in direction Y, and consequently, among the sub fields $2033_1 \sim 2033_N$, the sub fields toward the both ends, in particular, are positioned in the areas which are relatively distant from the optical axis AX, the projection distortion resulting from the deflection distortion caused by the deflectors 2009, 2010, 2013 and 2014 and the distortion caused by the projection lenses 2011 and 2012 increases. Furthermore, since the boundary areas $2035_1 \sim 2035_{N-1}$ are present between the adjacent sub fields $2033_1 \sim 2033_N$ on the mask M, it is necessary to perform offset correction on the deflection quantities of the detections imparted by deflectors 2009, 2010, 2013, and 2014 in correspondence to the boundary areas $2035_1 \sim 2035_{N-1}$. Thus, in this example, the parameters for correcting the deflection distortions caused by the deflectors and the distortions caused by the projection lenses are determined and stored in memory for each of the sub fields $2033_1 \sim 2033_N$ of the mask M, and the main control system 2005 performs correction of the projection distortion based upon these parameters, as explained below. Given above so far is an explanation in regard to the structures of the charged particle beam projection apparatus, the mask M and the wafer W.

Next, in reference to FIGS. 8A and 11A–11C, an example of a method in which parameters for correcting deflection distortion caused by the deflectors and distortion caused by the combination of the projection lenses and the deflectors are determined for each of the sub fields $2033_1 \sim 2033_N$ of the mask M, is explained.

Figure 11A:
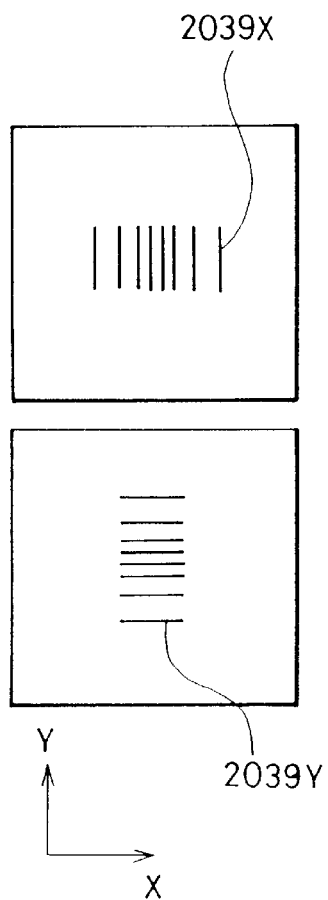
FIG. 11A shows the alignment patterns formed in the test mask that is used when measuring the distortion caused by the lens and the deflection system.

First, instead of the mask M shown in FIG. 8, a test mask in which specific alignment patterns are formed is placed on the mask stage 2006. In FIG. 11A, which shows the alignment patterns formed in the test mask, Y axis alignment patterns 2039Y which are achieved by arranging a plurality of linear patterns (transmission portions for the electron beam) extending in direction X at random pitches in direction Y and X axis alignment patterns 2039X that are achieved by rotating the alignment patterns 2039Y by 90 degrees are shown to be formed over specific intervals in direction Y. Note that the alignment patterns 2039X and 2039Y are formed in different sub fields in one test mask.

Figure 11B:
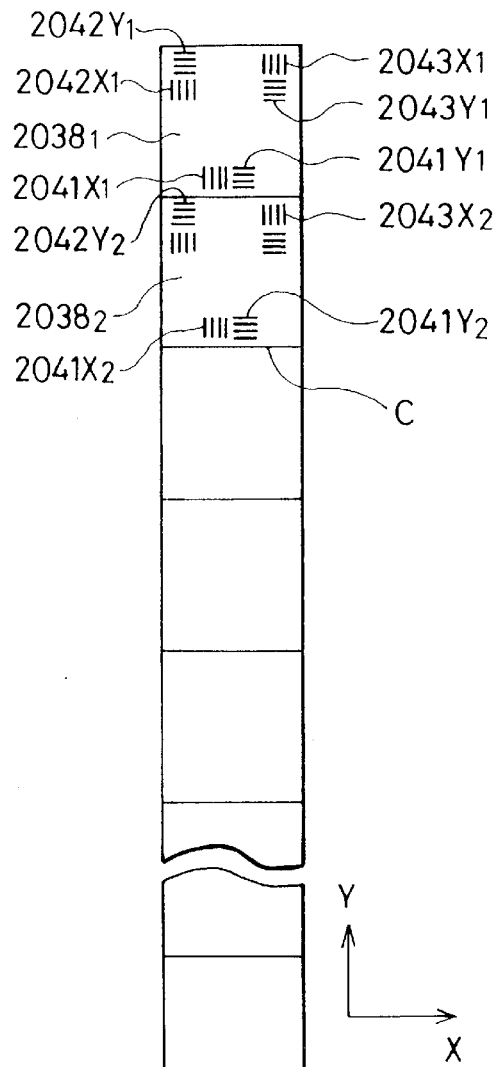
FIG. 11B shows an example of an arrangement of the alignment marks provided on a test wafer used in such measurement with a portion of it omitted.
Figure 11C:
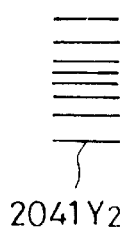
FIG. 11C is an enlargement of portion C in FIG. 11B.
Figure 12:
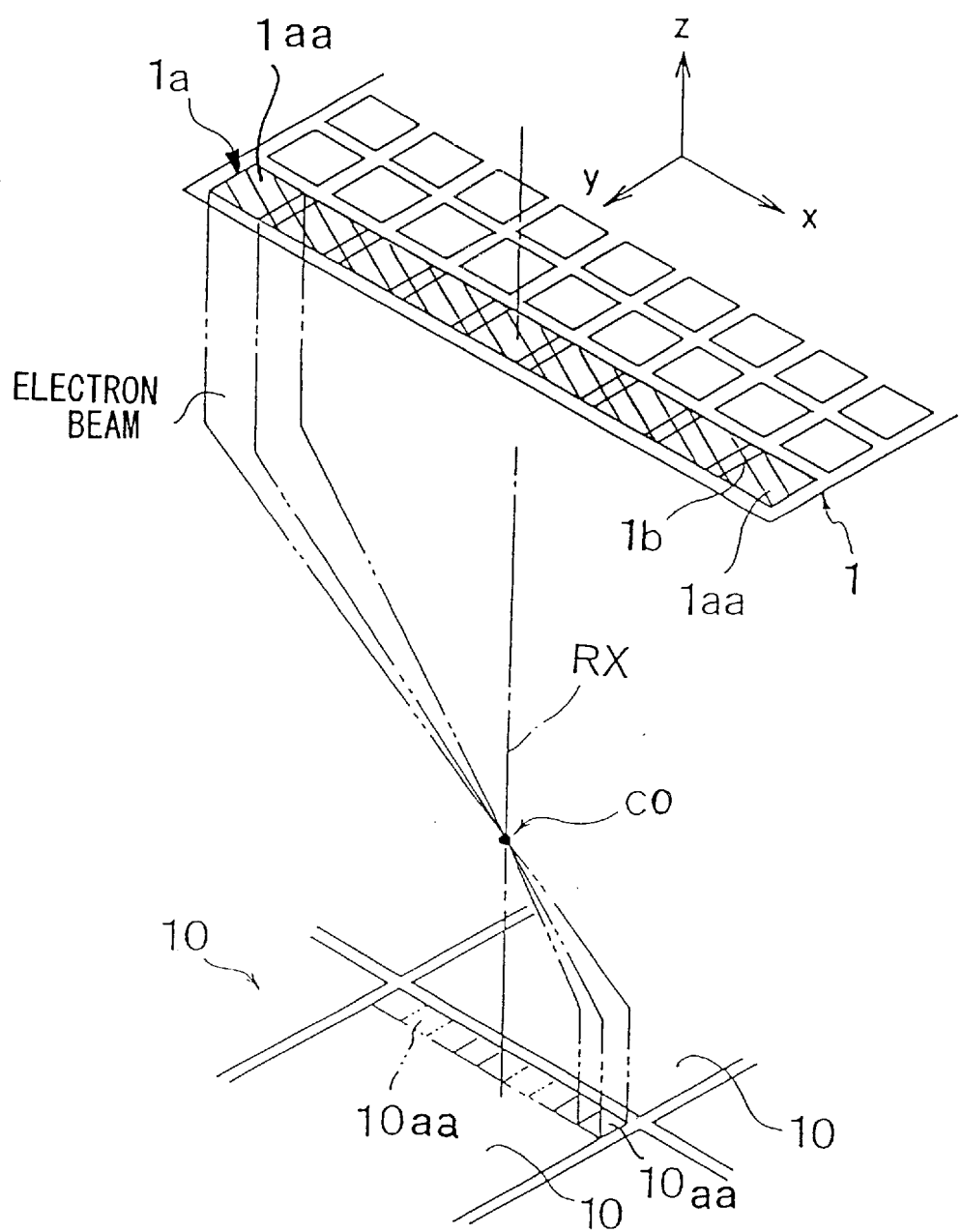
FIG. 12 is a schematic diagram illustrating sub fields of the mask 1 and the corresponding projection portions on the wafer.

Then, in place of the wafer W shown in FIG. 8, a test wafer in which specific test marks are formed is placed on the wafer platform 2018. In FIG. 11B, which shows the arrangement of the test marks formed on the test wafer, three pairs of test marks are shown to be formed at each of the sub projection areas $2038_1, 2038_2, \ldots, 2038_N$ that are arranged in direction Y at a specific pitch. The pitch of the sub projection areas $2038_1, 2038_2, \ldots, 2038_N$ in direction Y is the same as the pitch of the sub projection areas onto which the patterns in the sub fields $2033_1 \sim 2033_N$ on a regular mask M are projected. To be more specific, within the first sub projection area $2038_1$, an X axis test mark $2041X_1$ and a Y axis test mark $2041Y_1$ are formed in those proximity to the end which is the closest to the optical axis in direction −Y, an X axis test mark $2042X_1$ and a Y axis test mark $2042Y_1$, are formed in + proximity at one end which is the farthest from the optical axis (in direction +Y and also in direction −X) and an X axis test mark $2043X_1$ and a Y axis test mark $2043Y_1$ are formed in close proximity as an other and that is furthest away from the optical axis (in direction +Y and also in direction +X).

In this manner, in each of the other sub projection areas $2038_m$ (m=2 ∼N) too, an X axis test mark $2041X_m$ and a Y axis test mark $2041Y_m$ which are closest to the optical axis, an X axis test mark $2042X_m$ and a Y axis test mark $2042Y_m$ which are located at one end furthest away from the optical axis and an X axis test mark $2043X_m$ and a Y axis test mark $2043Y_m$ which are at the other end furthest away from the optical axis are formed in the same arrangement as in the first sub projection area $2038_1$. As FIG. 11C, which gives an enlarged view of the test mark $2041Y_2$ as a typical example, shows, each of the Y axis test marks $2041Y_n$, $2042Y_n$, $2043Y_n$, (n=1∼N) constituting a pattern in which the Y axis alignment patterns 2039Y shown in FIG. 11A is reduced at a projection magnification rate of β of the projection performed from the mask M onto the wafer W in FIG. 8, which may be, for instance, a pattern formed by the plurality of linear patterns constituting the test mark $2041Y_2$ scattering the electron beam. Also, the test marks $2041X_n$, $2042X_n$ and $2043X_n$ are each achieved by rotating the test mark $2041Y_2$ by 90 degrees.

Consequently, in this embodiment, since, when the reduced image formed by the X axis alignment patterns 2039X of the test mask that is projected onto the wafer platform 2018 is aligned with any of the X axis test marks $2041X_n$, $2042X_n$ or $2043X_n$ on the test wafer in direction X, for instance, the detection signal output from the backscattered electron detector 2021 shown in FIG. 8 is set to the highest maximum, the main control system 2005 is capable of performing detection as to whether or not the reduced image of the alignment patterns 2039X is aligned with any one of the X axis alignment marks in direction X. Likewise, the main control system 2005 is capable of performing detection as to whether or not the reduced image of each Y axis alignment patterns 2039Y is aligned with any of the Y axis test marks $2041Y_n$, $2042Y_n$, or $2043Y_n$ on the test wafer W based on the detection signal from the backscattered electron detector 2021. In addition, in this embodiment, the accurate positional relationships among the X axis test marks $2041X_n$, $2042X_n$ and $2043X_n$ and the Y axis test marks $2041Y_n$, $2042Y_n$ and $2043Y_n$ on the test wafer are measured in advance by a separate coordinate measuring device.

Next, by driving the XY stage 2019 provided on the wafer side in FIG. 8 to move the test wafer, the center of the main projection area which contains the sub projection areas $2038_1, 2038_2, \ldots, 2038_N$ in FIG. 11B is made to almost align with the optical axis AX. In order to achieve this, positioning marks may be formed on the test wafer so that the positions of these marks relative to the wafer platform 2018 can be detected by an alignment sensor (not shown). Likewise, the position of the mask stage 2006 is sequentially determined in such a manner that the center of the arrangement of the alignment patterns 2039X or 2039Y shown in FIG. 11A is almost aligned with the optical axis AX.

Then, by driving the mask stage 2006 in direction X and in direction Y based upon the measured values at the laser interferometers 2008Y and 2008X1 and 2008X2 to move the test mask, an alignment mark corresponding to the alignment patterns 2039X is moved to the sub field position which, it is expected in design that the reduced image of the alignment patterns 2039X shown in FIG. 11A is to be projected on the X axis test mark $2041X_N$ in the sub projection area $2038_N$ at an end in FIG. 11B. At this time, the position of the alignment patterns 2039X is moved to a position which is set by taking into consideration the boundary areas $2035_1$, $2035_2$, ..., $2035_{N-1}$ provided between the adjacent sub fields $2033_1$~$2033_N$ on a regular mask M, as shown in FIG. 10A. Then, while the electron beam EB is being irradiated onto the alignment patterns 2039X by the sub field selecting deflector 2003, the quantities of deflection of the electron beam EB in direction Y imparted by the deflectors 2009 and 2010 are set at the design values and by swinging the deflection quantity back and forth relative to the design value in direction X over a specific range, the reduced image of the alignment patterns 2039X is scanned in direction X on the test mark $2041X_N$ on the test wafer. In this case, the two deflectors 2009 and 2010 are driven at the same current.

Now, in the main control system 2005, the level of the drive signal for the first main deflector 2009 and the first sub deflector 2010 output when the detection signal from the reflected electron detector 2021 is at its maximum, i.e., when the reduced image of the alignment patterns 2039X formed on the test wafer W is aligned with the test mark $2041X_N$ in direction X, is stored in memory. Since the deflection sensitivity of the first main deflector 2009 and the first sub deflector 2010 is already known, the quantity of deflection of the reduced image of the alignment patterns 2039X on the test wafer in direction X is calculated by multiplying the drive signal level with this deflection sensitivity. Based on this deflection quantity, the X coordinate, the Y coordinate and the rotating angle of the mask stage 2006, the X coordinate $x_{N1}$ of the test mark $2041X_N$ in the coordinate system of the mask stage 2006 is determined. Then, based upon this X coordinate $x_{N1}$, the X coordinate, the Y coordinate and the rotating angle of the wafer platform 2018, the X coordinate $x_{N1}'$ of the test mark $2041X_N$ in the coordinate system of the wafer platform 2018 is determined. Likewise, the X coordinates $x_{N2}'$ and $x_{N3}'$ of the X axis test marks $2042X_N$ and $2043X_N$ in FIG. 11B on the wafer platform 2018 are calculated by moving the alignment patterns 2039X to a corresponding position and controlling the quantity of deflection imparted by the first main deflector 2009 and the first sub deflector 2010.

Then, by moving the test mask via the mask stage 2006 shown in FIG. 8, the alignment patterns 2039Y is moved to a sub field position at which, it is expected in design, the reduced image of the alignment patterns 2039Y shown in FIG. 11A is projected on the Y axis test mark $2041Y_N$ in the sub projection area $2038_N$ at one end in FIG. 11B. At this time, the position of the alignment patterns 2039Y is moved to a position which is selected by taking into consideration the boundary areas $2035_1$, $2035_2$, ..., $2035_{N-1}$ provided between the sub fields $2033_1$~$2033_N$ on a regular mask M, as shown in FIG. 10A. Then, while the electron beam EB is being irradiated on the alignment patterns 2039Y via the field selecting deflector 2003, the electron beam EB is shifted over a specific range back and forth relative to the design value in direction Y via the deflectors 2009 and 2010, and by monitoring the detection signal from the backscattered electron signal detector 2021, the Y coordinate $Y_{N1}$ of the test mark $2041Y_N$ on the coordinate system of the mask stage 2006 is determined. Based upon this Y coordinate $Y_{N1}$, the X coordinate, the Y coordinate and the rotating angle on the wafer platform 2018, the Y coordinate $Y_{N1}'$ of the test mark $2041Y_N$ in the coordinate system of the wafer platform 2018 is determined.

In a manner similar to that described above, the Y coordinates $y_{N2}'$ and $y_{N3}'$ of the other two Y axis test marks $2042Y_N$ and $2043Y_N$ in the coordinate system of the wafer platform 2018 are measured. In addition, in the coordinate system of the wafer platform 2018, the X coordinate and the Y coordinate of each of the X axis test marks $2041X_n$, $2042X_n$ and $2043X_n$ and the Y axis test marks $2041Y_n$, $2042Y_n$ and $2043Y_n$ within all the sub projection areas $2038_n$ (n=1~N) shown in FIG. 11B are measured.

While, so far, an explanation has been given on the method for measuring the coordinates of the test marks on the test wafer W for each of the sub fields $2033_1$~$2033_N$ on the mask M, now an explanation is given below of an example in which these measured values are used to calculate parameters for correcting distortions caused by the combination of the projection lenses 2011 and 2012 and deflectors 2009, 2010, 2013 and 2014 in the pattern in each sub field on the mask. Let us assume here that, as shown in FIG. 11B, calculation is performed here to determine the parameters in the sub field which corresponds to the sub projection area $2038_1$ at an end in direction Y on the test wafer, i.e., in the sub field $2033_1$ at one end in FIG. 10A. In this calculation, since the projection lenses 2011 and 2012 in FIG. 8 are axially symmetrical to each other, the measured values of the coordinates of the test marks in the sub projection areas $2038_1$ and $2038_N$ at both ends in direction Y in FIG. 11B are used. The X coordinates of the X axis test marks $2041X_1$, $2042X_1$ and $2043X_1$ within the sub projection areas $2038_1$ measured in the coordinate system constituted of the wafer platform 2018 are respectively designated $x_{11}'$, $x_{12}'$ and $x_{13}'$ whereas the Y coordinates of the Y axis test marks $2041Y_1$, $2042Y_1$ and $2043Y_1$ measured in the coordinate system of the wafer platform 2018 are respectively assigned $y_{11}'$, $y_{12}'$ and $y_{13}'$. In addition, the X coordinates of the test marks $2041X_1$, $2042X_1$, $2043X_1$, $2041X_N$, $2042X_N$ and $2043X_N$ which are measured in advance by a separate coordinate measuring device are respectively designated $x_{11}''$, $x_{12}''$, $x_{13}''$, $x_{N1}''$, $x_{N2}''$ and $x_{N3}''$ whereas the Y coordinates of the test marks $2041Y_1$, $2042Y_1$, $2043Y_1$, $2041Y_N$, $2042Y_N$ and $2043Y_N$ are respectively designated $y_{11}''$, $y_{12}''$, $y_{13}''$, $y_{N1}''$, $y_{N2}''$ and $y_{n3}''$.

In this case, if the distortion in direction X and the distortion in direction Y caused by the projection lenses in the sub field 20331 at a position close to the optical axis are designated $\Delta x_{n1}$ and $\Delta y_{n1}$ respectively, these distortions are expressed as follows:

$$\Delta y_{n1} = (y_{11}' - Y_{N1}') - (y_{11}'' - y_{n1}'') \qquad (16A)$$

$$\Delta x_{n1} = (x_{11}' - x_{N1}') - (x_{11}'' - x_{N1}'') \qquad (16B)$$

Also, the distortions in X direction and the distortions in the Y direction caused by the projection lenses within the same sub field at two positions distanced from the optical axis are designated $\Delta x_{n2}$, and $\Delta x_{n3}$, $\Delta y_{n2}$ and $\Delta y_{n3}$ respectively, expressed as;

$$\Delta y_{n2} = (y_{12}' - y_{N2}') - (y_{12}'' - y_{N2}'') \qquad (17A)$$

$$\Delta x_{n2}=(x_{12}'-x_{N2}')-(x_{12}''-x_{N2}'') \quad (17B)$$

$$\Delta y_{n3}=(y_{n3}'-y_{13}')-(y_{N3}''-y_{13}'') \quad (18A)$$

$$\Delta x_{n3}=(x_{N3}'-x_{13}')-(x_{N3}''-x_{13}'') \quad (18B)$$

At this point, the distortions $\Delta x_{n1}$ and $\Delta y_{n1}$ at the closest position to the optical axis in all these distortions are the minimum distortions $\Delta x_{nmin}$ and $\Delta y_{nmin}$ within the sub field. In addition, when the larger distortion of the distortions $\Delta x_{n2}$ and $\Delta x_{n3}$ in direction X at the two positions distanced from the optical axis is designated $\Delta x_{nmax}$ and the larger distortion of the two distortions $\Delta y_{n2}$ and $\Delta y_{n3}$ in direction Y is designated $\Delta y_{nmax}$, the following values are used for the distortions $\Delta x_n$ and $\Delta y_n$ in directions X and Y respectively of the reduced image of the sub field $2033_1$, caused by the projection lenses.

$$\Delta y_n=(\Delta y_{nmin}+\Delta y_{nmax})/2 \quad (19A)$$

$$\Delta x_n=(\Delta x_{nmin}+\Delta x_{nmax})/2 \quad (19B)$$

Then, these distortions $\Delta x_n$ and $\Delta y_n$ are stored in memory as parameters for distortion correction in the sub field $2033_1$ and when the pattern in the sub field $2033_1$ is to be projected on the wafer W, the deflector for positional correction 2015 shown in FIG. 8 is operated to deflect the electron beam EB so that these distortions $\Delta x_n$ and $\Delta y_n$ are canceled out. With this, the pattern in the sub field $2033_1$ is projected onto the wafer W with the distortions corrected. In addition, since $\Delta x_n$ and $\Delta y_n$ represent the average values (median values) of the maximum values and the minimum values of the distortions within the sub field, the distortion that remains uncancelled within the sub field will be minimized in all. By using the average values of the maximum values and the minimum values of the distortions within each of the other sub fields as parameters for distortion correction in this manner, correction of distortion is performed with a high degree of accuracy.

In the explanation given above, an example of calculation of parameters used for correcting distortion in the reduced images of the patterns on the mask M caused by the combination of the projection lenses 2011 and 2012 and the deflectors 2009, 2010, 2013 and 2014 has been used. Now, an example of a method for correcting deflection distortion in the first main deflector 2009 and the first sub deflector 2010 shown in FIG. 8 is explained.

In this example, the relationship between the drive signal provided for the deflection system and the deflection quantity imparted by the deflection system is determined through measurement and the relationship between the drive signal and the deflection quantity thus measured is approximated in a polynomial expression of the drive signal. The coefficients of each order in the approximation polynomial is determined and stored in memory for each sub field. The coefficients to be stored in memory for each sub field are determined by averaging the maximum values and the minimum values measured in each sub field. In these cases too, the test mask with the alignment patterns 2039X and 2039Y formed as shown in FIG. 11A and the test wafer with the test marks shown in FIG. 11B formed are used. The deflection distortion at the sub field $2033_1$ at one end in FIG. 10A which corresponds to the sub projection area $2038_1$ at the upper end of the test wafer shown in FIG. 11B is measured. Hence, the mask stage 2006 is driven to move the alignment patterns 2039Y to the sub field position where it is expected that the reduced image of the Y axis alignment patterns 2039Y is formed on the Y axis test mark $2041Y_1$ within the sub projection area $2038_1$ on the test wafer W shown in FIG. 11B. This operation takes into consideration the widths of the boundary areas $2035_1$–$2035_{N-1}$ shown in FIG. 10A.

Then, the deflectors 2009 and 2010 shown in FIG. 8 are operated at this position to scan the reduced image of the alignment patterns 2039Y on the test mark 2041Y, in direction Y, the drive signal $D_{ns10}$ for the first main deflector 2009 and the first sub deflector 2010 provided when the reduced image of the alignment patterns 2039Y is aligned with the test mark $2041Y_1$ in direction Y is determined and stored in memory based upon the detection signal from the backscattered electron detector 2021 and the two-dimensional coordinates of the mask stage 2006 and the two-dimensional coordinates of the wafer platform 2018 are determined. Next the deflection quantity in direction Y of the electron beam which has passed through the sub field 20331 is switched to ⅓, ⅔ and 1/1 of the deflection quantity and at each setting, the drive signal $D_{ns1k}$ (k=1~3) for the first main deflector 2009 and for the first sub deflector 2010 is measured in the manner described below. Namely, by driving the XY stage 2019 provided on the wafer side in FIG. 8 to move the sub projection area $2038_1$ in FIG. 11B to ⅓, ⅔ and 1/1 of the maximum exposure radius sequentially in direction Y relative to the optical axis, the drive signal $Dn_{ns1k}$ provided for the first main deflector 2009 and for the first sub deflector 2010 when the reduced image of the alignment patterns 2039Y is aligned with the test mark $2041Y_1$ on the test wafer W is measured at each setting.

At this time, the ratio of the difference in the drive signal $(D_{ns1k}-D_{ns10})$ for the first main deflector 2009 and for the first sub deflector 2010 to the drive signal $D_{ns1k}$ is equal to the ratio of the distance $\Delta Y_{1k}$ traveled by the XY stage 2019 (the relative traveled distance which is achieved by correcting the positional change caused by the vibration or the like of the mask stage 2006) to the quantity of deflection (designated $D_{n1k}$) imparted by the first main deflector 2009 and by the first sub deflector 2010. Consequently, the deflection quantity $D_{n1k}$ achieved when the drive signal $D_{ns1k}$ is provided to the first main deflector 2009 and to the first sub deflector 2010 can be calculated using the following formula:

$$D_{n1k}=D_{nslk}\cdot\Delta Y_{lk}/(D_{nslk}-D_{ns10}). \quad (20)$$

Since three sets of combinations of the drive signal $D_{n1sk}$ and the deflection quantity $D_{n1k}$ are achieved as a result, the following formula is used to determine the numerical values in each set with the coefficient $K_{nij}$ (j=1, 2, 3), $$D_{n1k}=K_{n11}\cdot D_{ns1k}+K_{n12}\cdot D_{ns1k}^2+K_{n13}\cdot D_{ns1k}^3. \quad (21)$$

Since there are three sets of variations of the formula, the three coefficients $K_{Kn11}$, $K_{n12}$ and $K_{n13}$ of these three sets can be calculated. Likewise, for the Y axis test mark $2042Y_1$ shown in FIG. 11B, too, the relationship between the drive signal $D_{ns2k}$ and the deflection quantity $D_{n2k}$ of the first main deflector 2009 and the first sub deflector 2010 is measured and the coefficients $K_{n2j}$ (j=1, 2, 3) which correspond to the coefficients in the formula (21) are determined. Furthermore, for the test mark $2043Y_1$ shown in FIG. 11B, too, the relationship between the drive signal $D_{ns3k}$ and the deflection quantity $D_{n3k}$ of the first main deflector 2009 and the first sub deflector 2010 is measured and the coefficients $K_{n3j}$ (j=1,2, 3) which correspond to the coefficients in the formula (21) are determined.

After this, the coefficient $K_{n1j}$ at the position that is close to the optical axis among these coefficients becomes the minimum coefficient min($K_{nij}$) in regard to that particular sub field. Also, the larger coefficient of the two coefficients $K_{n2j}$ and $K_{n3j}$ at the positions distanced from the optical axis is designated the maximum coefficient max($K_{nij}$) and using the following formula, the coefficient $k_{nj}$ (j=1, 2, 3) are determined, such that $$K_{n1}=(\max(K_{ni1})+\min(K_{ni1}))/2 \quad (22A)$$

$$K_{n2}=(\max(K_{ni2})+\min(K_{ni2}))/2 \quad (22B)$$

$$K_{n3}=(\max(K_{ni3})+\min(K_{ni3}))/2 \quad (22C)$$

Then, the coefficients $k_{nj}$ are stored in memory as parameters for correcting the deflection distortion in the sub field $2033_1$ caused by the first main deflector 2009 and the first sub deflector 2010. When actually projecting the pattern in the sub field $2033_1$, the following formula is used as an approximation polynomial which expresses the relationship between the drive signal $D_{ns}$ provided for the first main deflector 2009 and for the first sub deflector 2010 and its deflection quantity $D_n$.

$$D_n=K_{n1} \cdot D_{ns}+K_{n2} \cdot D_{ns}^2+K_{n3} \cdot D_{ns}^3 \quad (23)$$

With this, the residual deflection distortion in direction Y when projecting the pattern in the sub field $2033_1$ will be at the median value between the maximum value and the minimum value before correction and thus, pattern projection can be performed with at a high degree of accuracy. In this case, since the widths of the boundary areas $2035_1 \sim 2035_{N-1}$ shown in FIG. 10A are taken into consideration during the process of determining the coefficient $k_{nj}$, an advantage is achieved in that patterns in adjacent sub fields on the wafer can be projected in close contact and accurately.

An approximation polynomial is determined in a similar manner for the other sub fields. In addition, although in this embodiment, the deflection distortion in direction X does not present a critical problem since it is not necessary to deflect the electron beam EB greatly in the scanning direction (direction X), this deflection distortion in direction X can also be corrected very well by using the X axis alignment patterns 2039X and the test marks on the test wafer W.

What is claimed is:

1. A charged particle beam projection apparatus that projects a pattern in each of a plurality of sub fields into which a main field is partitioned onto a substrate and forms an image of a charged particle beam on the substrate sequentially projecting a pattern included in each of the sub fields, comprising:
    a mask that partitions said main field into a plurality of sub fields;
    a projection lens disposed on an image side of said mask in a path of said charged particle beam;
    a first deflection device provided at a stage preceding said projection lens or in said projection lens that deflects said charged particle beam after said charged particle beam has passed through the sub field so that said charged particle beam advances along a center of said projection lens; and
    a second deflection device that deflects said charged particle beam after said charged particle beam has passed through said projection lens to induce said charged particle beam to a position on the substrate that corresponds to a position in the sub field on the mask.

2. A charged particle beam projection apparatus that projects a pattern on each of a plurality of sub fields into which a main field is partitioned onto a substrate and forms an image of a charged particle beam on the substrate sequentially projecting a pattern included in each of said, sub fields, comprising:
    a mask that partitions said main field into a plurality of sub fields;
    a projection lens disposed on an image side of said mask in a path of said charged particle beam;
    a first deflector that deflects said charged particle beam from a sub field by a specific angle in a direction relative to an optical axis;
    a second deflector that deflects said charged particle beam from said first deflector by said specific angle to cause said charged particle beam to advance along said optical axis;
    a third deflector that deflects said charged particle beam from said projection lens by said specific angle of deflection imparted by said second deflector; and
    a fourth deflector that deflects said charged particle beam from said third deflector by said specific angle to induce said charged particle beam to a position on the substrate that corresponds to a position in the sub field on said mask.

3. A charged particle beam projection apparatus according to claim 2, wherein:
    when a reduction rate of said charged particle beam projection apparatus is defined as 1/M where M is a positive real number which is greater than 1, and a point on said optical axis that divides a distance between said mask and the substrate into two portions whose ratio is at M:1 is defined as a crossover;
    among distances LC11, LC12, LC13 and LC14 between said crossover and said first deflector, between said crossover and said second deflector, between said crossover and said third deflector, and between said crossover and said fourth deflector respectively, at least one relationship expressed in

LC11/LC14=M

LC12/LC13 =M is satisfied.

4. A charged particle beam projection apparatus according to claim 2, wherein:
    said projection lens is constituted with a first magnetic lens which is a mask side magnetic lens and a second magnetic lens which is a substrate side magnetic lens with directions of magnetic fields formed by said first magnetic lens and said second magnetic lens running opposite from each other.

5. A charged particle beam projection apparatus according to claim 4, wherein:
    when a reduction rate of said charged particle beam projection apparatus is defined as 1/M where M is a positive real number which is greater than 1, at least one of the ratios of an inner diameter of said first deflector and a corresponding inner diameter of said fourth deflector, of an outer diameter of said first deflector and a corresponding outer diameter of said fourth deflector, and of a length of said first deflector in a direction of said optical axis and a corresponding length of said fourth deflector in said direction of said optical axis is at M:1.

6. A charged particle beam projection apparatus according to claim 4, wherein:

a reduction rate of said charged particle beam projection apparatus is defined as 1/M where M is a positive real number which is greater than 1 and a point on said optical axis which divides a distance between said mask and the substrate into two portions whose ratio is at M:1 is defined as a crossover; and a distance LC1 between said crossover and a principal plane of said mask side magnetic lens and a distance LC2 between said crossover and a principal plane of said substrate side magnetic lens are determined so that $$LC1/LC2=M$$

is satisfied.

7. A charged particle beam projection apparatus according to claim 4, wherein:

a reduction rate of said charged particle beam projection apparatus is defined as 1/M where M is a positive real number which is greater than 1; and a ratio of a focal length of said first magnetic lens and a focal length of said second magnetic lens is at M:1.

8. A charged particle beam projection apparatus according to claim 2, wherein:

said first deflector and said fourth deflector are multi-electrode electrostatic deflectors constituted with a pair of relatively large parallel electrodes and at least 4 electrodes which are smaller than said parallel electrodes.

9. A charged particle beam projection apparatus that projects a pattern on each of a plurality of sub fields into which a main field is partitioned onto a substrate and forms an image of a charged particle beam on the substrate sequentially projecting a pattern included in each of said sub fields, comprising:

a mask that partitions said main field into a plurality of sub fields;

a projection lens disposed on an image side of said mask in a path of said charged particle beam, said projection lens including a first magnetic lens which is a mask side magnetic lens and a second magnetic lens which is a substrate side magnetic lens with directions of magnetic fields formed by said first magnetic lens and said second magnetic lens running opposite from each other;

a first deflector that deflects said charged particle beam from a sub field by a specific angle in a direction relative to an optical axis;

a second deflector that deflects said charged particle beam from said first deflector by said specific angle to cause said charged particle beam to advance along said optical axis;

a third deflector that deflects said charged particle beam from said projection lens by said specific angle of deflection imparted by said second deflector; and a fourth deflector that deflects said charged particle beam from said third deflector by said specific angle to induce said charged particle beam to a position on the substrate that corresponds to a position in the sub field on said mask;

wherein a reduction rate of said charged particle beam projection apparatus is defined as 1/M where M is a positive real number which is greater than 1, a ratio of a focal length of said first magnetic lens and a focal length of said second magnetic lens is at M:1, said projection lens is constituted with said mask side magnetic lens and said substrate side magnetic lens, and when bore radii of a magnetic pole of a mask side magnetic lens and of a crossover side magnetic pole are designated R1 and R2 respectively, distances between said crossover and a crossover side surface of said mask side magnetic pole and between said crossover and a mask side surface of said substrate side magnetic pole are respectively designated A1 and A2, all of which are related to said mask side magnetic lens, and distances between a principal plane of said substrate side magnetic lens and the substrate and between said principal plane and said crossover are respectively designated LW2 and LC2, bore radii of a substrate side magnetic pole and of a crossover side magnetic pole are designated r1 and r2 respectively, and distances between said crossover and a crossover side surface of said substrate side magnetic pole and between said crossover and a mask side surface of said crossover side magnetic pole are respectively designated a1 and a2, all of which are related to said substrate side magnetic lens, in which relationships expressed in $$R1/r1=R2/r2=M$$

$$A1/a1=A2/a2=M$$

are satisfied.

10. A charged particle beam projection apparatus according to claim 9, wherein:

an inner diameter of said first deflector is twice or more a diameter of a largest field on the mask and an inner diameter of said fourth deflector in twice or more a largest diameter of a projected image field on the substrate that corresponds to said diameter of said largest field.

11. A charged particle beam projection apparatus that projects a pattern onto a substrate by forming an image of a charged particle beam on said substrate comprising:

a mask disposed in a path of said charged particle beam;

a first magnetic lens; and a second magnetic lens, wherein a reduction rate of said charged particle beam projection apparatus is defined as 1/M where M is a positive real number which is greater than 1, a position that divides a distance between said mask and the substrate on an optical axis into two portions whose ratio is M:1 being defined as a crossover, and said first magnetic lens is provided between the mask and said crossover, and said second magnetic lens is provided between said crossover and the substrate and between a bore diameter D1 of a mask side magnetic pole, a bore diameter D2 of a crossover side magnetic pole, a distance A1 from said crossover to a crossover side surface of said mask side magnetic pole and a distance A1 from said crossover to a mask side surface of said crossover side magnetic pole, all of which are related to said first magnetic lens, and a bore diameter D1 of a substrate side magnetic pole, a bore diameter d2 of a crossover side magnetic pole, a distance a1 from said crossover to a crossover side surface of said substrate side magnetic pole and a distance a2 from said crossover to a substrate side surface of said crossover side magnetic pole, all of which are related to said second magnetic lens, in which relationships expressed in $$D1=M \cdot D1, \ D2=M \cdot d2, \ A1=M \cdot a1, \ A2=M \cdot a2$$

are established, and between a lens casing inner diameter D3, a lens casing outer diameter D4, both of which are related to a lens casing of said first magnetic lens, and a lens casing inner diameter d3, and a lens casing outer diameter d4, both of which are related to said lens casing of said second magnetic lens, at least one equation in $$D3=M \cdot d3, \ D4=M \cdot d4$$

is satisfied.

12. A charged particle beam projection apparatus according to claim 11, further comprising:

a cylindrical magnetic shield sheathing said first magnetic lens and said second magnetic lens with a diameter thereof four times or more an outer diameter of said first magnetic lens.

13. A charged particle beam projection apparatus that projects a pattern onto a substrate by forming an image of a charged particle beam on the substrate comprising:

a mask disposed in a path of said charged particle beam;

a first magnetic lens; and a second magnetic lens, wherein a reduction rate of said charged particle beam projection apparatus is defined as 1/M where M is a positive real number which is greater than 1, a position that divides a distance between the mask and the substrate on an optical axis into two portions whose ratio is M:1 being defined as a crossover, said first magnetic lens is provided between the mask and said crossover, and said second magnetic lens is provided between said crossover and the substrate, and between a bore diameter D1 of a mask side magnetic pole, a bore diameter D2 of a crossover side magnetic pole, a distance A1 from said crossover to a crossover side surface of said mask side magnetic pole and a distance A2 from said crossover to a mask side surface of said crossover side magnetic pole, all of which are related to said first magnetic lens and a bore diameter d1 of a substrate side magnetic pole, a bore diameter d2 of a crossover side magnetic pole, a distance a1 from said crossover to a crossover side surface of said substrate side magnetic pole and a distance a2 from said crossover to a substrate side surface of said crossover side magnetic pole, all of which are related to said second magnetic lens, in which relationships expressed in $$D1=M \cdot D1, \ D2=M \cdot d2, \ A1=M \cdot a1, \ A2=M \cdot a2$$

are satisfied; and when $\epsilon$ and $\beta$ are arbitrary positive real numbers that satisfy $\epsilon < \beta$, a relationship between a lens casing inner diameter D3 of said first magnetic lens and a lens casing inner diameter d3 of said second magnetic lens is set to ensure that $$D3=M \cdot d3 - \epsilon$$

is satisfied and a relationship between a lens casing outer diameter D4 of said first magnetic lens) and a lens casing outer diameter d4 of said second magnetic lens is set to ensure that $$D4=M \cdot d4 - \beta$$

is satisfied.

14. A charged particle beam projection apparatus according to claim 13, further comprising:

a magnetic shield, sheathing said first magnetic lens and said second magnetic lens, which is provided with a first shielding portion at a first magnetic lens side and a second shielding portion at a second magnetic lens side, each portion extending from said crossover as a boundary with a shape of said first shielding portion and a shape of said second shielding portion achieving symmetry at the ratio of M:1 relative to said crossover.

15. A charged particle beam projection apparatus according to claim 14, wherein:

said first shielding portion and said second shielding portion are shaped cylindrically, a diameter D10 and a length L10 in a direction of said optical axis of said first shielding portion and a diameter D20 and a length L20 in said direction of said optical axis of said second shielding portion satisfy relationships expressed in $$D10=M \cdot D20, \text{ and}$$

$$L10=M \cdot L20.$$

16. A charged article beam projection method, comprising the steps of:

defining a plurality of main fields on a mask; partitioning each of the plurality of main fields into a plurality of sub fields thereby forming a projection pattern;

sequentially irradiating said plurality of sub fields with a charged particle beam and moving the mask and a substrate in synchronization with each other so that a pattern in each of said sub fields projects onto the substrate via an image forming lens system which corrects distortion of a projection image projected onto the substrate in each of said sub fields, wherein:

said projecting of said pattern onto the substrate via said image forming lens system includes focusing said charged particle beam by a projection lens system that focuses said charged particle beam that passed through the pattern in each of the sub fields on said substrate, and deflecting a charged particle beam by a deflection system part of which is disposed in said projection lens system that deflects a charged particle beam that passed through said pattern in each of said sub fields of said mask, said deflecting by said deflection system corrects an error of an image forming position of said projection pattern, said error being caused by a combination of said image forming lens system and said deflection system for each of the sub fields.

17. A charged particle beam projection method according to claim 16, further comprising the steps of:

measuring said distortions in projection positions on the substrate of a plurality of points inside each of the plurality of sub fields; and storing as a parameter for each of the sub fields maximum values and minimum values or average values of said maximum and minimum values of a plurality of said distortions thus measured.

18. A charged particle beam projection method, comprising the steps of:

defining a plurality of main fields on a mask;

partitioning each of the plurality of main fields into a plurality of sub fields thereby forming a projection pattern;

sequentially irradiating the plurality of sub fields with a charged particle beam; and moving the mask and a substrate in synchronization with each other so that a pattern in each of said sub fields projects onto the substrate via an image forming lens system which corrects distortion of a projection image projected onto the substrate in each of the sub fields, wherein:

said projecting of said pattern onto said substrate via said image forming lens system includes focusing said charged particle beam by a projection lens system that focuses said charged particle beam that passed through the pattern in each of the sub fields on the substrate, and deflecting a charged particle beam by a deflection system part of which is disposed in said projection lens system that deflects a charged particle beam that passed through said pattern in each of said sub fields of said masks and correcting a quantity of deflection imparted by said deflection system for each of the sub fields is effected in correspondence to said distortion of said projection pattern projected on the substrate, said distortion being caused when the sub fields are shifted by said deflection.

19. A charged particle beam projection method according to claim 18, further comprising the steps of:

measuring a relationship between a drive signal provided for said deflection system and a quantity of deflection imparted by said deflection system at a plurality of points inside each of the plurality of sub fields;

approximating said relationship thus measured with a polynomial of a drive signal;

storing in memory as a parameter for each of said sub fields maximum values and minimum values or average values of said maximum and minimum values of a coefficient of each order in said polynomial thus approximated for each of the sub fields; and correcting said distortion of said projection image projected on the substrate based upon said parameters thus stored in memory.

20. A charged particle beam projection apparatus comprising:

a mask disposed in a path of a charged particle beam emitted by a charged particle beam source;

a first deflection device disposed in said path of said charged particle beam on an image side of said mask;

a projection lens disposed in said path of said charged particle beam on said image side of said mask; and a second deflection device disposed in said path of said charged particle beam on an image side of said first deflection device and said projection lens, wherein said projection lens has a symmetry axis which is aligned substantially along an optical axis of said charged particle beam projection device, and said first deflection device deflects said charged particle beam to advance substantially along said symmetry axis of said projection lens.

21. A charged particle beam projection apparatus comprising:

a mask disposed in a path of a charged particle beam emitted from a charged particle beam source;

a first deflection device disposed in said path of said charged particle beam on an image side of said mask, said first deflection device deflects said charged particle beam by a predetermined angle relative to an optical axis of said charged particle beam projection apparatus;

a second deflection device disposed in said path of said charged particle beam on an image side of said first deflection device, wherein said second deflection device deflects said charged particle beam by a second angle substantially equal in magnitude and opposite in direction to said predetermined angle such that said charged particle beam advances substantially along said optical axis;

a projection lens disposed in said path of said charged particle beam on said image side of said first deflection device;

a third deflection device disposed in said path of said charged particle beam on said image side of said second deflection device, wherein said third deflection device deflects said charged particle beam by an angle substantially equal to said predetermined angle; and a fourth deflection device disposed in said path of said charged particle beam on an image side of said third deflection device, wherein said fourth deflection device deflects said charged particle beam by an angle substantially equal to said second angle.

* * * * *

UNITED STATES PATENT AND TRADEMARK OFFICE
CERTIFICATE OF CORRECTION

PATENT NO.    : 5,770,863

DATED         : June 23, 1998

INVENTOR(S)   : Nakasuji

It is certified that errors appear in the above-identified patent and that said Letters Patent is hereby corrected as shown below.

Claim 1, at column 25, line 50, change "sequentially projecting a pattern" to --by sequentially projecting a pattern--; and
lines 52-53, change "a mask that partitions said main field into a plurality of sub-fields" to --a mask on which said main field is partitioned into a plurality of sub fields--.

Claim 2, at column 26, line 5, change "sequentially projecting a pattern" to --by sequentially projecting a pattern-- and
lines 7-8, change "a mask that partitions said main field into a plurality of sub-fields" to --a mask on which said main field is partitioned into a plurality of sub fields--.

Claim 9, at column 27, line 36, change "sequentially projecting a pattern" to --by sequentially projecting a pattern--; and
lines 38-39, change "a mask that partitions said main field into a plurality of sub-fields" to --a mask on which said main field is partitioned into a plurality of sub fields--.

UNITED STATES PATENT AND TRADEMARK OFFICE
CERTIFICATE OF CORRECTION

PATENT NO.    : 5,770,863
DATED         : June 23, 1998
INVENTOR(S)   : Nakasuji It is certified that error appears in the above-identified patent and that said Letters Patent is hereby corrected as shown below.

Claim 18, at column 31, lines 13-14, change "pattern in each of said sub fields project onto the" to --pattern in each of the sub fields projects onto the--; and
lines 32-33, change "sub fields are shifted by said deflection" to --sub fields are shifted by said deflection system--.

Signed and Sealed this

Twentieth Day of October, 1998

Attest:

BRUCE LEHMAN

*Attesting Officer*    *Commissioner of Patents and Trademarks*